(12) United States Patent
Ferguson et al.

(10) Patent No.: US 8,046,730 B1
(45) Date of Patent: Oct. 25, 2011

(54) SYSTEMS AND METHODS OF EDITING CELLS OF AN ELECTRONIC CIRCUIT DESIGN

(75) Inventors: Kenneth Ferguson, Endicott, NY (US); Randy Bishop, Endicott, NY (US); Arnold Ginetti, Antibes (FR); Gilles Lamant, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 594 days.

(21) Appl. No.: 12/222,499

(22) Filed: Aug. 11, 2008

(51) Int. Cl.
*G06F 17/50* (2006.01)

(52) U.S. Cl. ........ 716/139; 716/100; 716/101; 716/102; 716/118

(58) Field of Classification Search .................. 716/100, 716/101, 102, 118, 139
See application file for complete search history.

(56) References Cited

U.S. PATENT DOCUMENTS

| | | | | |
|---|---|---|---|---|
| 5,592,392 A * | 1/1997 | Matheson et al. | ............ | 716/119 |
| 6,574,779 B2 * | 6/2003 | Allen et al. | .................... | 716/103 |
| 6,804,809 B1 * | 10/2004 | West et al. | .................... | 716/119 |
| 7,418,683 B1 * | 8/2008 | Sonnard et al. | ............... | 716/122 |
| 7,546,556 B1 * | 6/2009 | Wagner | ......................... | 716/110 |

* cited by examiner

*Primary Examiner* — Sun Lin
(74) *Attorney, Agent, or Firm* — Kilpatrick Townsend & Stockton LLP

(57) ABSTRACT

Systems and methods to enable a user to edit subMaster content of selected instances of an electronic layout design, including editing the contents of selected instances of an existing subMaster of an EDA design, generating a new subMaster to incorporate the modified contents of the selected instances, and binding the new subMaster to the selected instances without losing the design hierarchy of the layout design.

26 Claims, 15 Drawing Sheets

SYSTEMS AND METHODS OF EDITING CELLS OF AN ELECTRONIC CIRCUIT DESIGN

BACKGROUND OF THE INVENTION

1. Field of the Invention

The present general inventive concept relates generally to the field of electronic circuit design and manufacturing, and more particularly relates to an electronic design automation (EDA) system to edit and save changes to cells of an electronic circuit design.

2. Description of the Related Art

Circuit designers can create a custom design of integrated circuits, printed-circuit boards, and other electronic circuit systems using electronic design automation (EDA) technologies that typically run on an operating system in conjunction with a microprocessor-based computer system or other programmable control system. For analog, RF, and mixed signal design applications, the EDA software allows a user to implement "cells" as a basic element of functionality through a layout editor implemented on a graphical user interface. A given cell may be placed, or "instanced," many times in a layout design to accelerate the design process. In a parameterized cell (pcell), a designer may select and modify certain design parameters to define desired operational features and physical properties of selected electronic components in a particular design application, for example, an integrated circuit (IC). A pcell is typically more flexible than a non-parameterized cell (non pcell) because different instances of the pcell may have different parameter values. For example, with a transistor pcell, the length, width, number of gate segments, and/or other design elements of the transistor, can be realized by simply inserting or changing one or more parameter values. Rather than have many different cell definitions to represent the variously sized transistors in a given design, a single pcell may take a transistor's dimensions (e.g., width and length) as parameters. Different instances of a single pcell can then represent transistors of different sizes, but otherwise similar characteristics.

Conventionally, a parameterized cell or pcell exists at three different levels: superMaster, subMaster, and instance. The superMaster typically resides in a computer readable medium, such as a disk, and consists of program code, parameter definitions and default values. The subMaster, which receives properties from an associated superMaster, typically resides in virtual memory, and contains unique geometries produced by a unique set of parameter values. The instance, which inherit parameters and content from an associated subMaster by means of being bound to that subMaster, also typically resides in virtual memory.

Those skilled in the art will appreciate that the term "subMaster" means a cell master created by evaluating pcell code associated with the superMaster, for a given unique set of parameter values. Traditionally superMasters have a disk representation, have associated parameter definitions, and code associated with them. subMasters are traditionally created in-memory (i.e., volatile memory), on demand, for each unique set of parameters associated with instances in the open design. subMasters are traditionally stored in-memory, not disk, and are traditionally not edited by the user. Attempts have been made to allow subMasters to be stored on disk, for faster opening of designs, but existing approaches do not permit editing of subMaster content in layout editors.

The actual shapes that comprise the subMasters are typically created by a function associated with the pcell, usually written in a programming language such as SKILL, for example. The EDA system can then automatically generate multiple representations of the electronic components of the pcell based on the assigned parameters.

Traditional EDA systems fill, or assign, the content of a pcell subMaster according to its pcell parameters by executing the pcell code. The resulting pcell subMaster contents produced by the pcell program code are considered as correct by definition. Typically, if an instance is bound to this subMaster, an instance parameter changes, and the instance's master is requested by the EDA system (for example to draw the instance), the EDA system automatically searches in memory for an existing pcell subMaster with parameters matching the new set of parameters, and on failure to find such a subMaster, triggers a recomputation of a new pcell subMaster with the new set of parameters, by executing the pcell code, and binds the instance to that new subMaster. The pcell can then be viewed from different levels in the design hierarchy as a cell instance of the overall circuit design.

Design hierarchy refers to an electronic circuit design having a collection of different levels (e.g., level 0, 1, 2, . . . , n), wherein each higher level hides the details and shapes of the lower levels to simplify the design process. That is, a design hierarchy allows the circuit design to be broken down into a collection of smaller designs (or levels), thus reducing visual complexity of the design process, and enabling the EDA system to work with a collection of smaller design files so the design tools can run faster. In contrast, flat design files (i.e., no design hierarchy) are typically very large since all of the details are included in the same level, thus increasing the visual complexity of the design and causing the design tools to run more slowly. Existing approaches which attempt to make local edits in a hierarchical layout design while retaining design hierarchy typically involve modifying parameters on instances at level n in order to initiate a re-computation of the pcell sub-master bound to that instance. Such parameter modification can be initiated either graphically, for example, by clicking and dragging the boundaries of a cell to change the size of a cell (e.g., stretching stretch handles) or by dragging one cell to adjoin another cell (e.g., abutment), or by modifying parameter values on the instance directly, for example, by using a property editor or other editing interface to view and edit the parameter values of a cell. One drawback of existing approaches is that although they may allow a user to modify pcell parameters through stretching stretch handles and abutment, they are less than satisfactory in allowing other edits since the contents of the new sub-master are limited to what the pcell programming code is capable of generating, and is controlled by parameter modifications on the instance, with results being that only the edits that the pcell designer has built into the pcell programming code can be made. In other words, free editing of the contents of a pcell sub-master to form another pcell subMaster is not currently available. To work around this limitation, users sometimes flatten the pcell instances throughout the layout design, but this results in losing the design hierarchy and increasing memory usage. Accordingly, existing approaches do not enable a user to easily and efficiently make local edits of masters of instances in hierarchical designs without losing the hierarchical structure of the design, and do not allow editing of subMaster content of selected instances, to form new subMasters with different parameters, which can then be saved to disk.

Another drawback of existing approaches is that they do not allow the retention of user edits to shapes during automatic parameter modifications such as auto-abutment and stretching stretch handles. For example, in existing approaches, users are unable to retain their edits during pcell abutment or after user-initiated changes of parameters of instances whose masters have been edited. Another drawback of the existing approaches is that in order to make edits to one particular instance of a pcell the user must manually save a copy of the pcell master, apply their edits in the non pcell copy cellview, and then manually re-master the one instance that they wish to be affected to the new non pcell cell view they created. Users must do this to ensure that other instances of the same master are not affected by the edit.

Moreover, existing approaches to cell editing do not provide the ability to easily make a local edit to a single instance of a non-pcell master, if there are multiple instances of that master in the design because such edits of an existing master affect all instances. Instead, in order to make local edits to a non-pcell master of one instance of a non-pcell design, a user must undertake the manual, time-consuming process of saving a copy of the non-pcell sub-design, applying the local edits, and then manually re-mastering the instance to the copy design containing the edits. Such limited editing capabilities of these and similar existing approaches has become a serious problem for customers, who do not want to be constrained to only those edits that the process design kit (PDK) designer has built into the respective design cell offerings. PDKs typically include an assortment of component libraries, cells, technology files, and physical verification files to improve design capabilities and data flow, and offer the user a limited range of validated components and design automation features to speed the design process, and to support the physical implantation of the custom design with full chip integration, silicon analysis features, and full chip integration support.

SUMMARY OF THE INVENTION

Systems and methods to enable a user to edit subMaster content of selected instances of an electronic layout design, including editing the contents of selected instances of an existing subMaster of an EDA design, generating a newSubmaster to incorporate the modified contents of the selected instances, and binding the new subMaster to the selected instances without losing the design hierarchy of the layout design. The systems and methods of the present general inventive concept can thus enable a user to edit the content of an existing subMaster associated with selected instances of the layout design, either directly from the top-level design, or by descending into the subMaster to edit shapes of existing instances from a lower-level, and then returning to the top level upon completion of the fluid edit without losing the layout design hierarchy. The present general inventive concept can be applied to achieve edits of subMaster content requested by a user, and to achieve edits performed by components of an EDA tool, for example, by using a layout compactor or design for manufacturing (DFM) hotspot repair tool.

BRIEF DESCRIPTION OF THE DRAWINGS

These and/or other aspects and utilities of the present general inventive concept will become apparent and more readily appreciated from the following description of the embodiments, taken in conjunction with the accompanying drawings, of which.

DETAILED DESCRIPTION OF THE PREFERRED EMBODIMENTS

Figure 1:
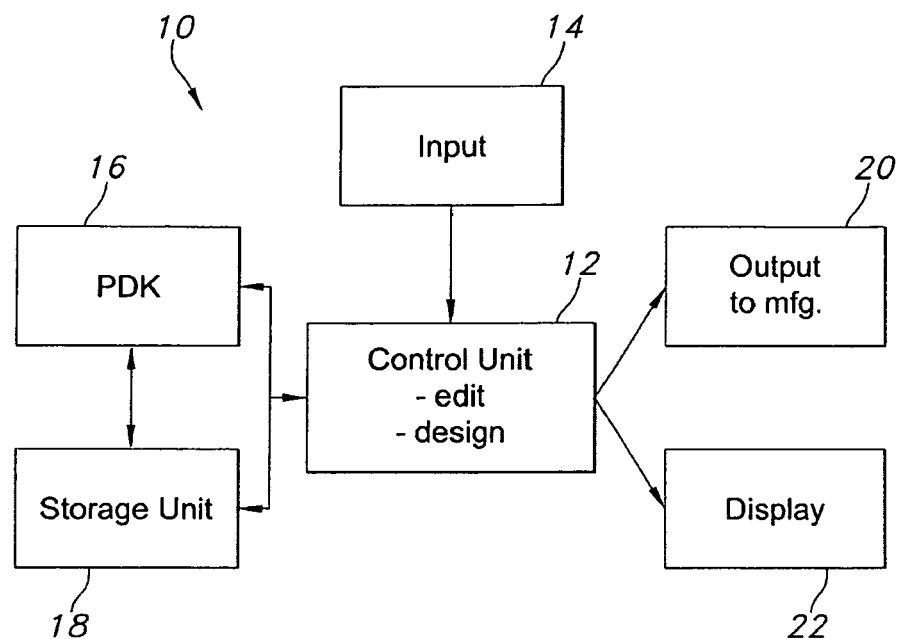
FIG. 1 is a schematic block diagram illustrating components of an electronic design automation (EDA) design system.
Figure 2:
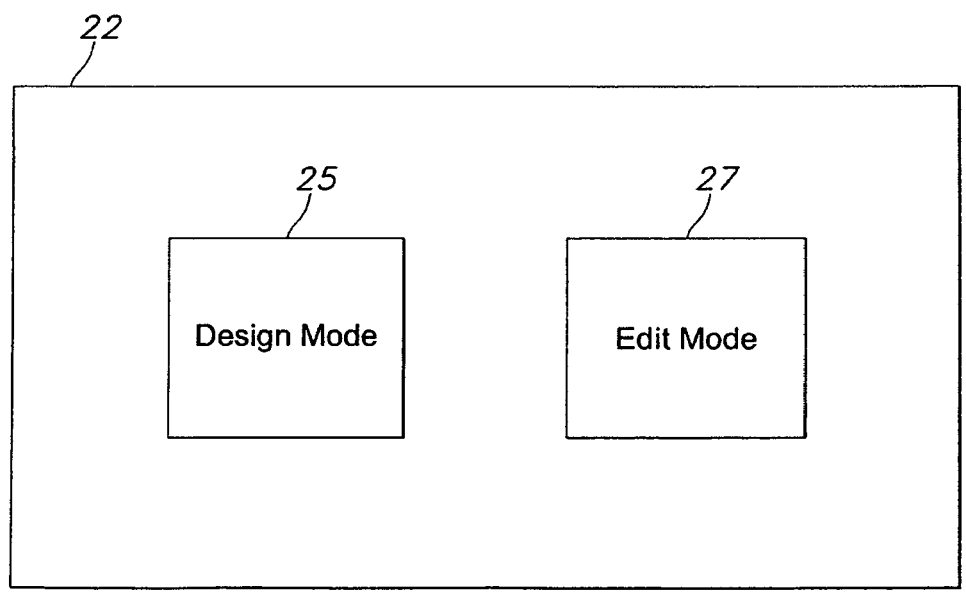
FIG. 2 is a block diagram illustrating two operational modes in accordance with an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

The present general inventive concept relates to an improved method and system of editing cells of an electronic circuit design, and to selectively apply such edits to other instances of the overall layout design, without requiring a user to manually create new cell views. Embodiments of the present general inventive concept may be implemented in industry standard electronic design automation (EDA) technologies, for example, the Cadence® Virtuoso® custom design system having a graphic user interface, or layout editor, running SKILL or other program code to assist a circuit designer to generate and implement customized electronic circuit designs. Although the present general inventive concept can be implemented to run with the Cadence custom design system, it is understood that the present general inventive concept is not limited thereto, and may also be implemented with other known or later developed EDA technologies or hardware description languages (HDL) capable of generating and manipulating cells and instances of cells to create and produce custom electronic layout designs. For example, embodiments of the present general inventive concept may find application between both the design side and the manufacturing side of customized electronic circuits and equipment. It is also understood that the present general inventive concept may find application in other types of layout design environments where editing of parent-child-type entities may be desired.

FIG. 1 is a schematic block diagram illustrating operational components of an EDA design system 10 in accordance with an embodiment of the present general inventive concept. These components are illustrated for purposes of convenience in describing aspects of the present general inventive concept and should not be construed as essential components of each and every embodiment of the present general inventive concept. As illustrated in FIG. 1, the electronic design system 10 may include a control unit 12, an input unit 14, a process design kit (PDK) 16, a storage unit 18, an output device 20, and a display unit 22. The control unit 12 may implement a processor-based control system to control and integrate operations of the design system 10. For example, the control unit 12 may include a software-based graphic design environment executing software program(s) to assist a user in generating and streamlining electronic layout designs.

The input unit 14 may take the form of a keyboard, mouse, pointer, or other input generating device to facilitate input of control instructions by a user to the control unit 12. The PDK 16 may contain information specific to a particular design task including libraries of symbols and views, pcells, technology files, and physical verification files, provided in suitable file formats and having an interface interconnected with the control unit 12 to enable a user to access cell level design solutions and optimize layout designs interactively via the input unit 14 and visual display unit 22. For example, one or more process design kits (PDK) 16 may be interconnected with the control unit 12 to provide a plurality of manufacturing-related parameters—from design rules to characterized models—to ensure a design will be manufacturable according to the user's original design intent. The assortment of component libraries of the PDK 16 can be collections of electronic devices stored in digital formats, and may be accessible by the EDA control unit 12. The digital content of the library may be stored locally, or accessed remotely via a computer network. The physical verification files can be provided in the PDKs to help ensure correctness and appropriateness of design choices via a variety of design rules issued with the PDK.

The cells provided with the PDK may be accessed by the designer by way of a graphical user interface or layout editor visualized by the display 22.

Pcells reduce design entry time and design rule violations, while providing an accelerated level of design automation to minimize tedious and repetitive layout tasks. As such, pcells may be used to support the ability of a user to change the size, shape, or contents of each cell instance without changing or losing the original cell content. By lowering to the component level of the design hierarchy, pcells simplify the manner in which complex shapes and devices can be generated, edited, and managed with variable settings, thus accelerating layout tasks and reducing design violations.

The storage unit 18 may comprise one or more memory devices, for example, RAM, ROM, cache, data registers, or other types of virtual or disk memory to facilitate storage and manipulation of program code, data, PDKs, and the like. The design system 10 may further include an output unit 20 to facilitate physical implementation of a user's custom designs by providing a direct link to manufacturing processes at the silicon or chip level.

As illustrated in FIGS. 2 to 5, the display unit 22 may visualize a graphical user interface or layout editor having a design mode 25 and an edit mode 27 to enable a user to generate and edit custom electronic circuit designs. While the present general inventive concept can employ different graphic controls associated with the design mode 25 and the edit mode 27, it is not intended that the scope of the present general inventive concept be limited to any particular configuration of the layout editor. It will also be appreciated that the present general inventive concept is not limited to providing the design mode 25 and the edit mode as separate and distinct functions of the layout editor. The present general inventive concept can employ many different types and configurations of graphic controls and functions in a manner that enables users without programming skills to use and implement the tools of the present general inventive concept within the layout editor. It will also be appreciated that the tools and features of the present general inventive concept may also be implemented through an understanding and use of the application programming language of the EDA system.

Figure 3:
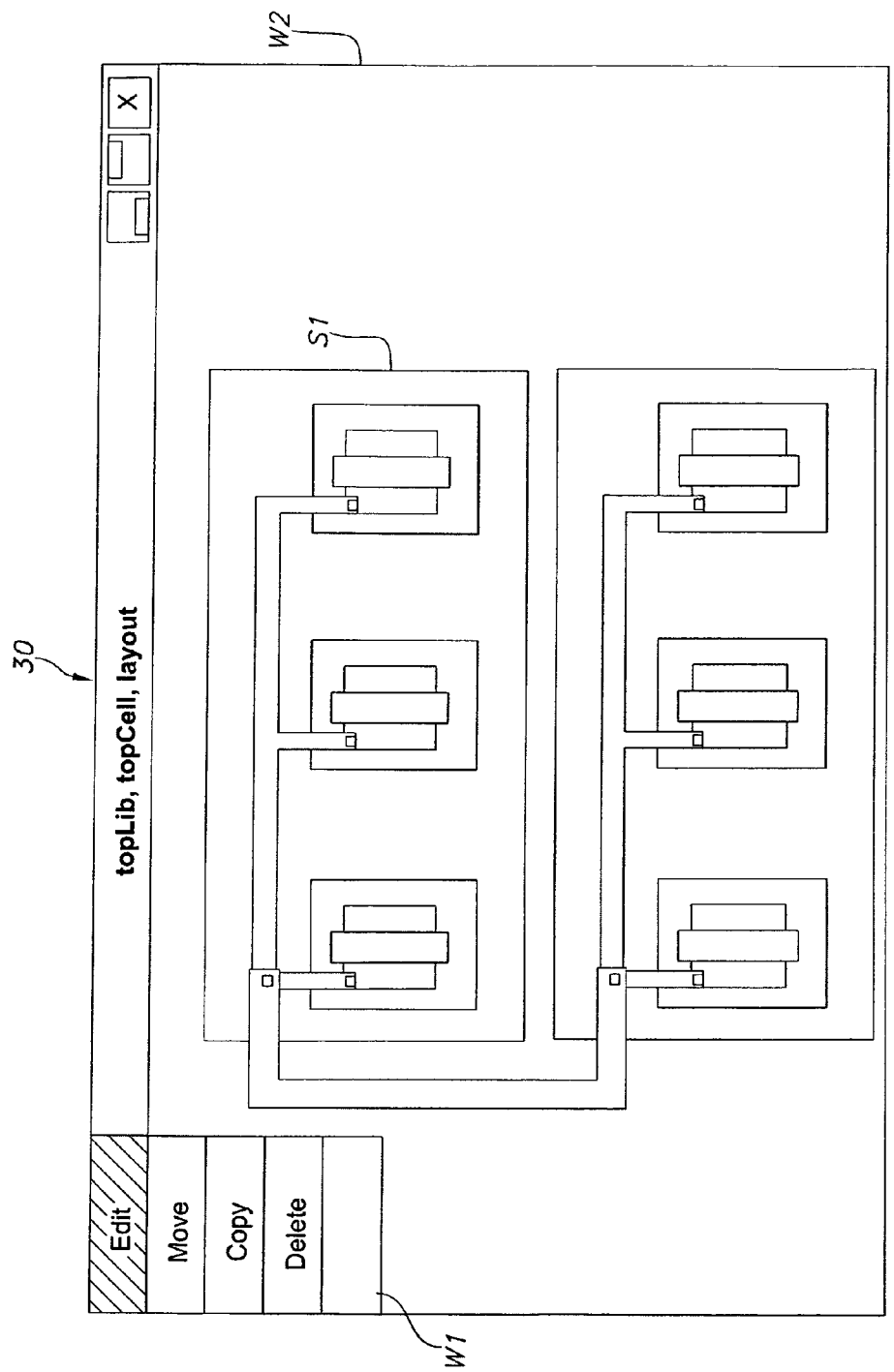
FIG. 3 is a screen display of a graphical user interface illustrating a top level view of a layout editor in accordance with an embodiment of the present general inventive concept.

As illustrated in FIG. 3, the layout editor may include a viewer 30 having one or more drop-down menus W1 to adjust properties of the viewer 30, and a main display window W2 to display a top level view of a custom hierarchical layout design whose cellName is "topCell" in library "topLib" and whose view name is "layout", henceforth referred to as (topLib, topCell, layout) cellview. The viewer 30 provides a user with an intuitive navigational environment to assist the user to locate and select particular areas of detail within the context of the overall layout design. Here, the user may select an instance named "S1" to view properties thereof, and/or to subsequently descend into the cell master of instance S1 (sLib, sCell, layout) as illustrated in FIG. 4.

In accordance with the present general inventive concept, an editing command can be provided to enable a user to edit subMaster content of selected instances of the layout design, and to generate new subMasters associated with the edited instances, without losing the hierarchical structure of the layout design. That is, the systems and methods of the present general inventive concept can enable a user to edit the content of selected instances of an existing subMaster in the context of a top level EDA design by generating a newSubmaster pcell having the modified contents, and then binding the new subMaster to selected instances of the layout design without changing the contents of the non-selected instances of the original subMaster. For convenience of description, such editing process may be referred to herein as "fluid editing," although it will be appreciated that many other terms or phrases may be used to describe the systems and methods of the present general inventive concept without departing from the broader principles and scope of the present general inventive concept. For example, terms such as "fluid editing," "fluidEdit," "fluidKey," "fluidCell", and the like, may be used to describe exemplary aspects and features of the present general inventive concept, but it will be appreciated that the present general inventive concept is not limited thereto, and that many other terms and phrases could be used to describe the systems and methods of the present general inventive concept without departing from the broader principles and scope of the present general inventive concept. Similar to conventional "Edit-In-Place" commands of existing solutions, the fluidEdit command of the present general inventive concept allows a user to perform, for example, edits of level 1 geometry (i.e., geometry in the master in the context of level 0 (top level). However, unlike conventional Edit-In-Place, the "fluid edits" of the present general inventive concept are not saved to the original master of the instance, and are thus not shared by all instances of the original master. Instead, the edits apply to selected instances of the original master (since a new subMaster is created for selected instances), and not to all instances which originally shared the same master. As described above, the fluid edit operation can be invoked by a new fluidEdit command, but it is appreciated that many different initiation techniques could be used to invoke the fluid edit operations without departing from the principles and spirit of the present general inventive concept. For example, the fluid edit operations could be invoked from a variation of an existing editor command, such as a modified "Edit-in-Place" command. Moreover, the fluid edit operations could be invoked by directly editing or manipulating shapes within an instance of a cell master in a chosen level of a hierarchical layout design without having to invoke a FluidEdit or Edit-in-Place type command and without having to select instances first.

As described in more detail below, upon completion of the fluid edit command, the geometry of an edited subMaster can be optionally matched against geometry of existing fluid edited subMasters, and if no match found (or no match done), a new pcell variant can be created. A special "fluidKey" pcell parameter can be set on the edited instances, whose value can be used to uniquely identify and bind the selected instances to the fluid-edited subMaster to which those fluid-edited instances are now associated. For purposes of the present disclosure, the unique pcell key parameter may be referred to as "fluidKey," although other names could be used without departing from the present general inventive concept. In some embodiments, the user or PDK developer may manually add the "fluidKey" parameter to the pcell definition to carry-out the fluid edit operation, which means the user or PDK developer could code the "fluidKey" parameter into their pcell definitions. However, in other embodiments, it is understood that the EDA control system can be configured to automatically create the "fluidKey" parameter for the user, thus automatically creating the "fluidKey" parameter on the pcell superMasters and subMasters for the user. Other embodiments may use more than one additional parameter for purposes of binding selected instances to a newly created fluid edited subMaster.

Figure 4:
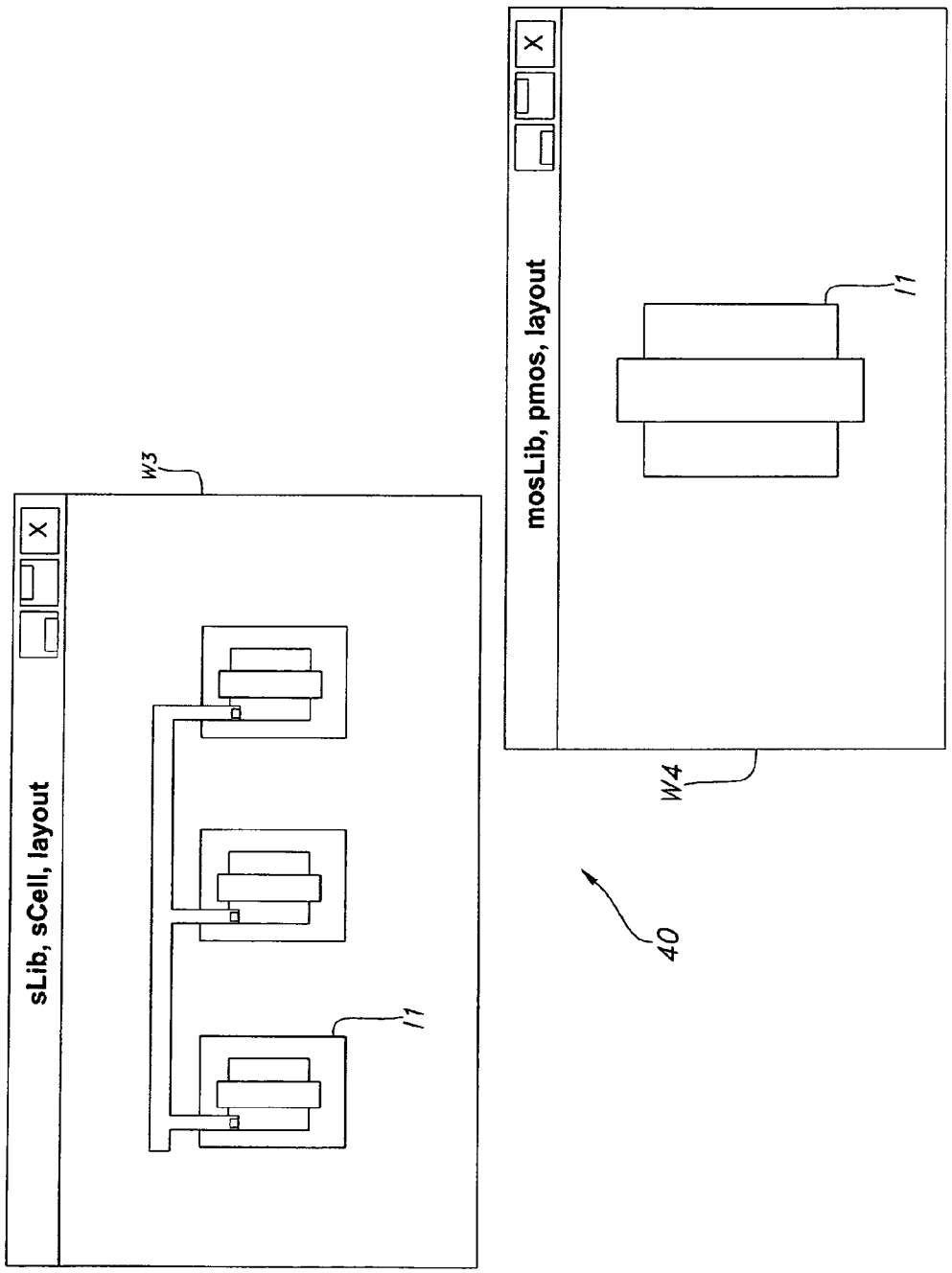
FIG. 4 is a screen display of a graphical user interface illustrating a hierarchical multi-window editing environment to select instances of a cell master.

In FIG. 4, there is illustrated an exemplary multi-window editing environment 40 of the layout editor including, for example, windows W3 and W4 to enable a user to descend or push into lower levels of the layout design hierarchy by clicking on respective instances or portions of the top level design and/or by using zooming tools of the layout editor to zoom into lower levels of the layout design. For example, as illustrated in FIG. 4, the hierarchical multi-window editing environment 40 may be configured to visualize multiple instances of cells at different levels of design as illustrated in window W3, and/or to select an instance I1 as illustrated in window W3 and descend into its master cellview in another window W4 as shown in FIG. 4. Here, the layout editor enables a user to open multiple cell views during any one editing session, and may simultaneously provide different views of the same design to help ensure consistency in complex designs. A layout editor canvas window can display the contents of a particular cell view. When the user selects particular instance(s) on the canvas to be edited, the user may enter an edit mode of the EDA system 10 to edit or modify specific attributes and master cell parameters of the lower level sub-design. To do so, the user may select the edit mode button 27 of FIG. 2, may click (or double click) on a particular cell view in the multi-window environment 40, or may enter the edit mode through any other suitable manual or automatic selection procedure supported by the layout editor to activate the edit mode.

Figure 5:
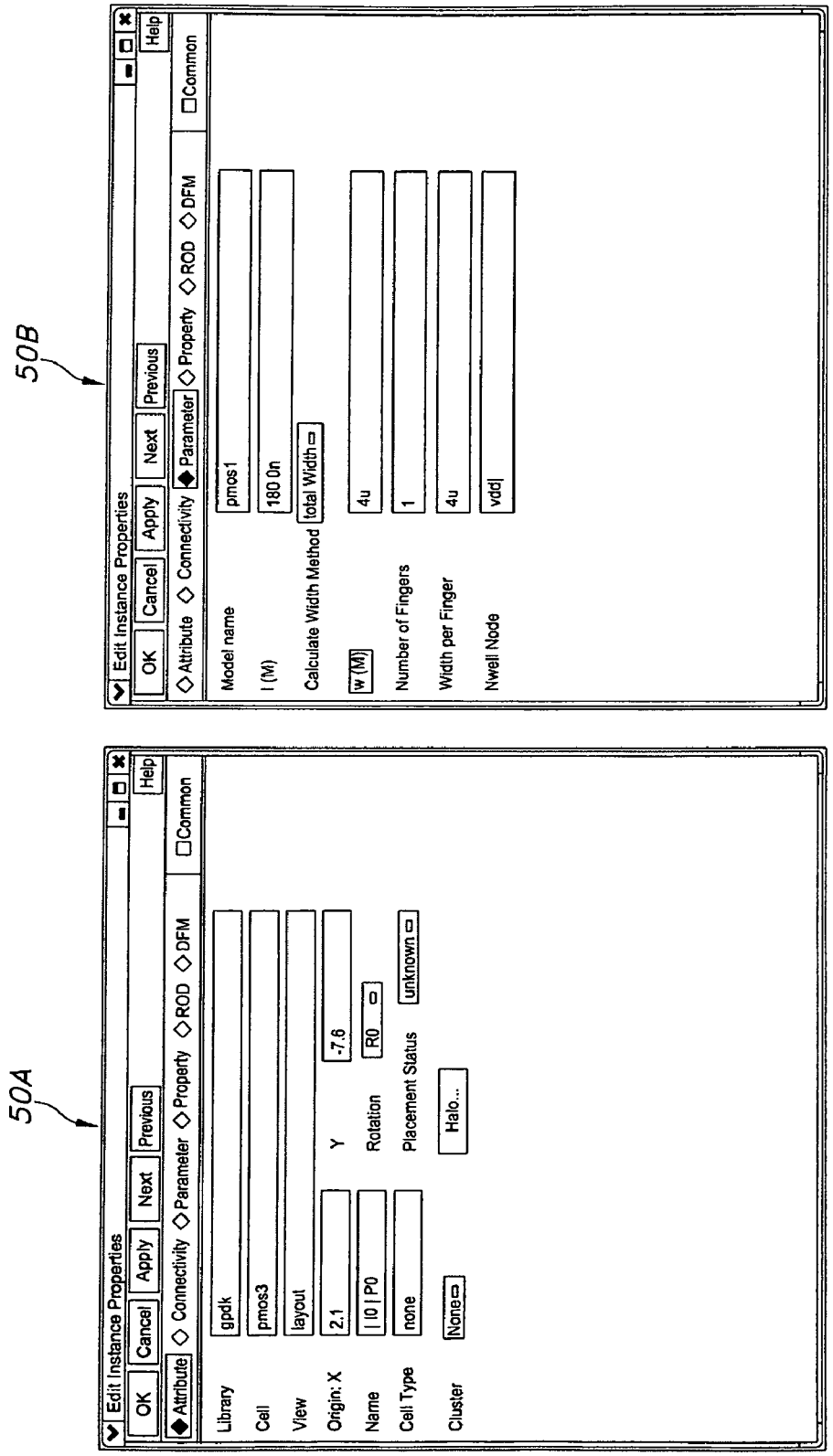
FIG. 5 is a screen display of a graphical user interface illustrating an edit properties window to edit contents of selected cells in accordance with an embodiment of the present general inventive concept.

FIG. 5 is a screen display illustrating an example edit instance properties windows 50A and 50B of the graphical user interface in accordance with an embodiment of the present general inventive concept which assists a user to edit or modify cell contents of the layout design when the edit mode is activated. The windows 50A, 50B typically contain a separate record of attributes for each instance (50A), and enable a user to modify cell parameters associated with specific instances of the layout design (50B). For example, various cell parameters belonging to particular instances may be modified here. The parameters may be of different types ranging, for example, from string, int, float, radio, cyclic, boolean, button, and the like. The cell parameters may have associated callbacks to perform the desired action or modification in response to mouse-clicks or selections made by the user in the edit properties windows.

As illustrated in window 50A of FIG. 5, each cell view record may normally include, but is not limited to, the following cell attributes or properties: Library Name, Cell Name, View Name, and if an instance is selected, its Instance Name. In window 50B, the CDF parameters may include, for example transistor length, transistor width, number of segments (fingers), etc. The Library name points to the cell library for that cell. The Cell Name is a unique identifier for that cell. The View Name is a unique identifier for that cell view. The Instance Name is a unique identifier for the instance selected within the cellview.

In order to generate a pcell instance, a library name, cell name, instance name, orientation, and the type and values of parameters may be specified by the user. A pcell superMaster typically includes a formal parameter table where each row of the table contains a pcell parameter name, parameter type (such as float, integer, Boolean, or string), and a default value. For example, the parameters for a resistor may include L, which specifies a length of a resistor segment; fingers, which specifies the number of fingers of the resistor; and q, which specifies a length of first and last connecting wires. Thus, by providing a mechanism for a user to access the program code to define operational and physical parameters of selected pcell instances, when the control unit requests the master of the selected instances, another part of the control unit either finds an existing sub-master whose parameters match those of the selected instances, and binds the instances to that existing sub-master, or if no matching sub-master is found in memory, then the code associated with the pcell super-master is evaluated with the given set of parameters resulting in a new in-memory pcell subMaster, which is bound to the given selected instances.

Figure 6:
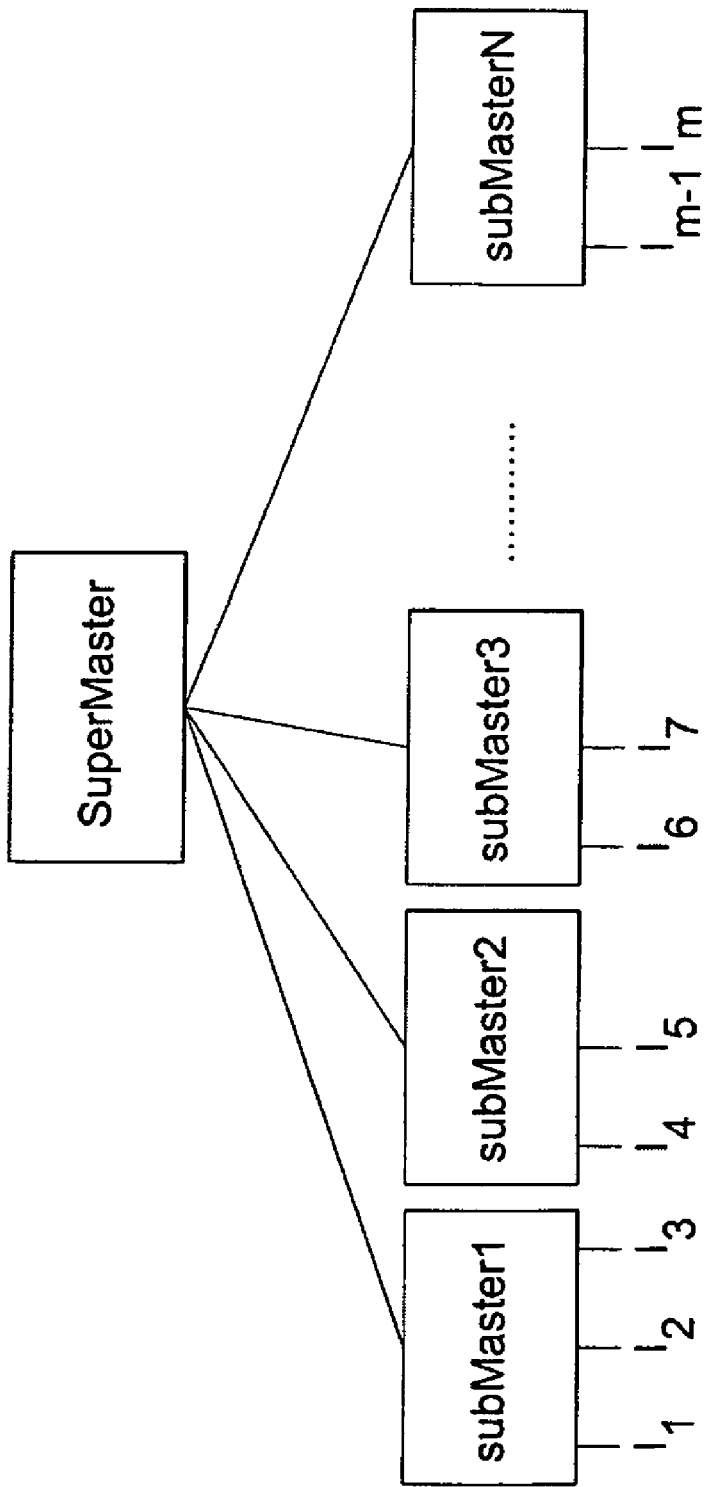
FIG. 6 is a diagram illustrating an example of the hierarchical structure of pcells.

FIG. 6 illustrates the basic pcell structure and its implementation in accordance with the present general inventive concept. As illustrated in FIG. 6, a parameterized cell or pcell can exist at three different levels: superMaster, subMaster, and instance ($I_m$). For convenience of description, the terms superMaster, subMaster, and instance will be used throughout the present disclosure to describe embodiments and operations of the present general inventive concept. However, those skilled in the art will appreciate that a variety of other terms could be used to describe the same or similar types of parameterized cells, and are to be included within the broader principles and scope of the present general inventive concept. Traditionally, unique subMasters can be created by evaluating the pcell code associated with the superMaster, with a given set of parameter values. pcell instances can be associated with a set of parameter values, and each group of pcell instances which have the same parameter values all bind to the same pcell subMaster. As described herein, the present general inventive concept can allow new subMasters to be created without evaluating pcell code. Instead new subMasters can be created by editing an existing subMaster, and then binding the new subMasters to selected instances of the original subMaster. To do so, a user can make manual edits of subMaster content by hand through the graphical user interface. However, it is appreciated that edits of subMaster content can also be made automatically through a component of an EDA tool, such as a layout compactor, or DFM hotspot repair tool, or can be made through use of the application programming language of the EDA system. To carry out the editing process, a unique parameter value can be set on the new subMaster to ensure that each unique pcell subMaster is associated with a unique set of pcell parameter values.

In FIG. 6, the superMaster of a pcell component is illustrated at the top, with each of the different subMasters representing different instances $I_1, I_2 \ldots I_m$ of the pcell used by a designer. FIG. 6 illustrates the relationship between a single superMaster, some of its subMasters and corresponding instances. Here, I1, I2, I3 represent pcell instances which have the same parameter values, and are bound to the same subMastert 14 and 15 have the same parameter values as each other, but the parameter value differs from that of I1, I2, and I3. Therefore 14 and 15 bind to a different subMaster2.

The layout designer can use the layout editor to create new pcell-subMaster content by conventional layout editing techniques applied to an existing subMaster. However, it is understood that the user does not necessarily have to descend from the top level of the layout design in order to make the layout edits, and the user may optionally invoke the fluid edit command on selected instance(s) at the top level, and then directly edit the displayed shapes that are inside the subMaster while in the context of the top level.

Figure 7:
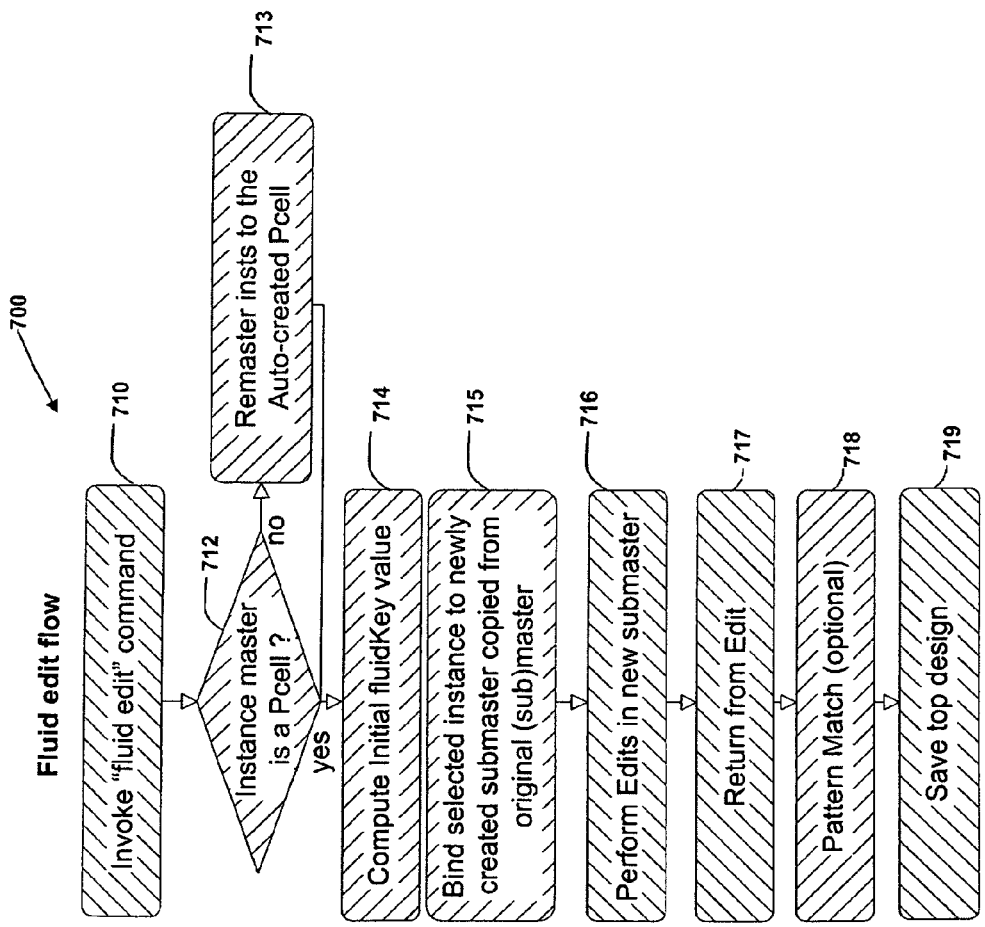
FIG. 7 is a flowchart illustrating a method of modifying a cell instance in accordance with an embodiment of the present general inventive concept.

FIG. 7 illustrates a flow chart illustrating fluid edit flow of a method 700 of fluid editing an instance of a cell master within the layout editor, beginning with an Invoke "fluid edit" command operation 710. In operation 710, the user may select (or may have already selected) one or more of the instance(s) which they would like to fluid edit within the layout editor. The user may initiate the fluid edit operation by invoking the fluidEdit command pre or post selection of instances. If more than one instance is selected, the fluidEdit command can check whether each of the instances are currently bound to the same sub-master. If not, the fluidEdit command does not get invoked, and an error message can be issued. To make the selection, the user can manipulate the graphic controls of the layout editor, which may involve (but is not limited to), checking or unchecking a check box, selecting one or more option boxes, selecting an entry in a list box, in a drop-down list box, in a list-edit box, or in a combination drop-down list-edit box. As mentioned above, the user may initiate a fluid edit request by selecting a particular set of one or more instances. Alternatively, the fluid edit operation may be initiated by directly selecting and editing the shapes (i.e., geometry) inside drawn subMasters. For example in FIG. 4, window W3, the user can select one of the shapes inside the subMaster of instance I1 and directly move or edit it, as illustrated in FIG. 4, window W4, even though that shape is inside a subMaster of pcell (mosLib, pmos, layout). In such a layout editor, initiation of this edit can automatically invoke the fluidEdit command, without requiring the user to manually invoke the fluidEdit command with a separate selection. In this regard, while the diagram in FIG. 7 shows one possible embodiment of the fluid edit flow, it will be appreciated that other embodiments of the present general inventive concept may implement this flow differently. For example, other embodiments may implement steps 714, 715 and 716 differently, that is, by allowing the edit to proceed in the original or new subMaster and then re-bind the instances to the new subMaster. The general inventive concept applies to all variants of this flow, which can ultimately result in the edited content being stored in a new subMaster (or existing fluid-edited subMaster if the edits result in a subMaster which substantially matches an existing fluid-edited subMaster) which has its parameters differentiated from the original subMaster by means of one or more automatically generated parameter values set on the instance and subMaster pcell parameters.

Referring again to FIG. 7, in operation 712, the program can determine if the master of the selected instance is a pcell subMaster. If so, the method 700 can proceed to operation 714. Otherwise, the method 700 can proceed to operation 713. In operation 713, if the program determines that the master of the selected instance(s) is not a pcell, the program automatically creates a new pcell to enable creation of fluid edit variants of instances whose masters were originally not pcells. In other words, the selected instance(s) can be remastered to a special auto-created pcell, allowing the user to fluid edit instances of masters that are not pcells, and preserving the fluid edit of a master that was not originally a pcell. For example, the software may name the auto-created pcell something like
lib/<originalMasterCellName>_pcell/layout.

Here, the auto-created pcell can be created in the library of the cellview containing the instance currently being fluid edited. The auto-created pcell will have just one parameter, being the "fluidKey" parameter. All of its variants will be fluid edited variants. Accordingly, if the selected instance(s) are re-mastered from its current master to the auto-created pcell in the current library, then that instance(s) can become an instance of the auto-created pcell. The pcell code for the auto-created pcell can simply take a single fluidKey parameter and does not have to create any new geometry, since all variants of the auto-created pcells can be fluid variants, stored in the co-managed fluid edit storage file of the parent design. That is, the new pcell variants resulting from fluid edits can be stored in a non-volatile fluid cellview disk file, which can be co-managed within design cellviews as the primary disk storage, although other disk file formats and locations may be used to store the fluid edited subMasters without departing from the present general inventive concept. Accordingly, the user does not have to manage the new pcell variants created as a result of the edit since the variants may be saved and accessed in the co-managed cache memory. The program is then able to use OpenAccess (OA) pcellFile APIs to read and write these fluid edited subMasters to disk files. As used herein, OpenAccess (OA) refers to an EDA initiative to open up access to EDA tools free of charge, and free of most copyright and licensing restrictions.

By facilitating the auto-creation of a new pcell—one of whose variants will store the edited cellview—and auto-remastering of the edited instance to the auto-created pcell, the present general inventive concept may overcome the limitations of existing approaches of making local edits to a non-pcell master of an instance. For example, by providing a mechanism for a user to access pcell program code to open a previously edited sub-master, the edited shapes in that edited sub-master can be freely queried and copied into the new subMaster that the users program code is currently filling.

In operation 714 (compute initial fluidKey value), the program can compute a string value to be used as fluidKey parameter value to uniquely identify the fluid edited subMaster when it is saved to disk. For example, a new function can be created:

char* dbComputeFluidCellKey(dbCellViewId (subMasterId).

This function can compute a unique key value associated with the edited subMaster, where the subMasterId in the function call is the cellviewId of the fluid edited subMaster. The key string can encode: (1) the Lib/cell/view name of the specific layout design in whose co-managed fluid edit disk file this edit will be saved; and (2) the unique string to identify this particular subMaster, which may simply be a number which is incremented for each new fluid edit. However, as discussed below with respect to operation 718, optional geometry pattern matching may be deployed in which case the unique string part of the fluidKey value may be recomputed to be more complex to encode the geometry pattern to match previously edited cells having similar contents. Accordingly, the unique key parameter value can be associated with the edited content, and may be defined using the program code associated with the edited content. Other embodiments may choose to use implement the fluidKey parameter value in some other manner, or may in fact use more than one additional parameter per pcell for identifying the edited subMasters uniquely. The general inventive concept applies to all other techniques which use additional pcell parameters to make the parameter set of an edited subMaster unique from the set of parameters associated with original subMaster from which the edited subMaster was derived In operation 715, the program can bind selected instances to a newly created subMaster which is copied from the original subMaster. Here, a copy of the instance's newly created, or current, subMaster can be written to disk in a temporary open access pcellFile. The fluidKey parameter value on each of the selected instances can be set to the computed value from operation 714, thus causing a re-bind of the selected instances to the newly created subMaster. To do so, the system can call OA function instance->getMaster( ) and the pcell evaluation of the new subMaster may load the copy saved earlier from the temporary fluid edit pcellFile on disk (see changes later to the applications subclass of IPCell::on Eval pcell evaluator function, which enable this). Once the selected instances are bound to the newly created subMaster, the temporary open access pcellFile may be deleted from disk.

Accordingly, the user can select instance(s) of the master to set a key parameter thereof based on the generated key value in order to apply the edited content to the selected instances. For example, the user may set a key parameter of the selected instances equal to the unique key value associated with the edited content of the newly created subMaster, thus updating the content of the selected instances in accordance with the modified content of the subMaster, by binding those selected instances to the new subMaster.

In operation 716, the user may perform edits to the newly created subMaster. Here, the fluidEdit command can by default allow users to make any connectivity or geometric edits, to any shape in the subMaster being edited. However two optional properties can be set on the shapes by the user's pcell code to prevent modifications, namely: (1) "noFluidEdit," where the editor can prevent editing or deleting of the shape, and (2) "noFluidDelete," where the editor can prevent deletion of the shape. This can be useful to keep track of which shapes have been edited during a fluid edit command, for example, for abutment code (described below). The edited shapes can be stored in the new subMaster using either an OA group, or OA AppDef. It should be appreciated that editing restrictions may be imposed on pcells by the pcell code, by specially tagging or marking shapes with a property indicating whether the shapes are fluid-editable or not. For example, shapes could be tagged as "fluidEditable," indicating that the shapes could be edited during a fluid edit operation. However, if the shapes are not tagged as "fluidEditable," they could not be edited during the fluid edit operation. Similarly, shapes could be tagged as "fluidDeletable," indicating that the shapes could be deleted in a fluid edit command. However, if the shapes are not tagged as "fluidDeletable," they could not be deleted during the fluid edit operation.

In operation 717, when the user returns from edit, the program may optionally initiate a process of trying to match the edited subMaster to an existing sub-master (see operation 718 below), or may simply create a new subMaster to rebind instances to the newly created subMaster that are determined to be changed when the user initiates exit from the fluidEdit command.

In operation 718, the program may optionally perform Pattern Matching to attempt to match currently edited cells with previously edited cells having similar contents to improve efficiency and reduce memory load. For example, if no pattern matching is performed, each initiation of a fluid edit command can result in a new fluid edited subMaster being created, and each new subMaster can be saved to disk when the user initiates a save of the top level design. However, if pattern matching is performed, it may be possible to reduce the number of fluid edited subMasters by pattern matching the geometry of the current fluid edited subMaster against all the other previously fluid edited subMasters of the same pcell, trying to find an existing subMaster whose content substantially matches the result of the edit.

With pattern matching, two different outcomes may be achieved. First, if a match is found, then the fluidKey values of the selected instances being fluid-edited can be replaced by the fluidKey parameter value of the matching subMaster. This serves to rebind the selected instances to the matching existing subMaster. The current subMaster will then be unbound, and since its fluidkey will not be further referenced, it need not be saved to disk. On the other hand, if no match is found, and the fluidKey unique string is used to encode the edited geometry, then the fluidKey value of the selected instances will be set to a new computed value based on the edited geometry. In this case, the new fluid edited subMaster will be saved to the temporary pcellFile as discussed above, and the new fluidKey value will be set on the selected instances. If the fluidKey value is not being used to encode the edited geometry (i.e., if the pattern matching algorithm is comparing shapes rather than key values), then the new fluidKey value can be used.

In operation 719, the user may save the design containing the instances in which the user or software component (program component) made fluid edits. This may be an optional operation, and does not have to be done immediately after return from fluid cell edit. However, if the operation 719 is not done at all, then of course the fluid edits would be lost. If the design is saved, then any fluid edited subMasters in the design can be saved to the fluid edit disk file associated with the design.

Referring now to the application's pcell evaluator on Eval function, the function can be modified to contain code such as:

```
if (fluidKeyParam && fluidKeyParamValue !="") {
  if (definingKey) {
    fillFluidSubMasterFromTemppcellFile(fluidKeyParamValue, subMaster);
    return;
  } else if (fluidSubMasterParamsMatchOnDiskParams(fluidKeyParamValue, subMaster) {
```

```
        fillFluidSubMasterFromFluidEditFile(fluidKeyParam-
            Value, subMaster);
        return;
        }
    }
}
<code Here To Fill SubMaster From pcell Code As
Before>
```

In the above example code, the "definingKey" Boolean can be set true temporarily in operations 715 and 718 of FIG. 7, to force the evaluator to load the subMaster from the temporary pcellFile instead of from the actual fluid-edited disk file, and instead of evaluating SKILL code.

The fluidSubMasterParamsMatchOnDiskParams function return value is unaffected by extra parameters in either the design subMaster being evaluated, or in the fluid edited subMaster identified by the key value. Extra parameters can occur if a pcell superMaster is redefined, and parameters are added or removed from its definition. Therefore, the fluid edited subMasters can be retrievable from the fluid edit disk store even if the pcell SuperMaster is redefined at some future time after the fluid edit has been done. Accordingly, the function returns true if the subset of parameters present in both the fluid edited subMaster identified by the fluidKey on disk and in the subMaster being evaluated all have matching values, and in that case will find the fluid edited subMaster in the fluid edit disk file whose fluidKey is equal to the given value regardless of the other parameter values.

Pcell superMasters may be redefined for a variety of reasons. For example, a new PDK version may be installed, and/or the pcell code defining the superMasters may change, including possible parameter changes. However, the present general inventive concept provides that even when pcell superMasters are recompiled and new parameters added or removed from the pcell definition, previously saved fluid edits can still be retrieved from the fluid edit disk store when a design containing fluid edited instances is loaded. In other words, persistence of fluid edits is maintained even after a superMaster is redefined.

In order for fluid edits to be operational, a new parameter can be added to the pcell definition in order to store the fluidKey parameter value. For purposes of the present disclosure this new parameter is called "fluidKey," but it is understood that the name of the parameter could be different, and could possibly be specified as a property of a pcell superMaster. The fluidKey parameter value string can encode: (1) the Lib/cell/view name of design in whose co-managed fluid edit disk files this edit will be saved, and (2) the unique string generated from shapes in the edited geometry, which may be just a number incremented for each new fluid edit, if pattern matching is not implemented.

Example Key Value:
    "desLib/topCell/layout,1"

Here the key value indicates that the fluid subMaster is: (1) in the fluid edit disk files associated with the layout view of topCell in library desLib; and (2) the number "1" is the unique number identifying this particular fluid edited subMaster. It is not necessary to store the lib/cell/view names of the pcell in the fluidKey string, because at the time of evaluation, the particular pcell will already be known. As noted above, the fluid editing techniques of the present general inventive concept encompass the use of a new pcell parameter such as "fluidKey," where the user can manually add the "fluidKey" parameter to their pcell definition themselves, or where the EDA control system automatically creates the pcell parameter for the user. In other words, some embodiments of the present general inventive concept may not require pcell developers to be aware of or code into their pcell definitions the "fluidKey" parameter. In such embodiments the "fluidKey" parameter can be automatically created by the program, but hidden from the user and PDK developer. Other embodiments may also use more than one new pcell parameter to differentiate the fluid edited subMasters, and other embodiments may use some other value other than the string value described above, the present general inventive concept applies to all other such embodiments.

In accordance with embodiments of the present general inventive concept, a new fluidEdit command can be provided in the layout editor to initiate fluid editing of selected instances, and a new fluidKey pcell parameter is provided to support fluid cell variants. Fluid cell variants are new pcell variants, selected by the value of the fluidKey parameter. In one embodiment, the edited variants can be saved in a fluid edit disk file store which is co-managed with the cellview of the design containing the instances being fluid edited. However, it is understood that disk files storing the fluid edited subMasters may not be co-managed without departing from the principles and spirit of the present general inventive concept.

Pcells can be automatically created to allow fluid edits to be made to instances which are not already pcells. In addition, there is no need to change a user's pcell code to support fluid edits on pcells. As described above, the present general inventive concept enables fluid edits of instances of a regular cellview, by turning the edited cellview into a variant of an auto-created pcell in the library of the design being edited. The auto-created pcells store the fluid-edited pcell subMasters which are created from fluid-editing instances whose masters which were originally not pcells. The present general inventive concept also thus allows the users pcell code to open edited variants of cellviews in order to copy edited shapes and retain the edits during pcell re-evaluations triggered due to abutment or other parameter changes. In other words, the user's pcell-code is able to open a fluid edited subMaster in order to copy fluid edited shapes from the fluid edited subMaster to a new subMaster.

As described in more detail below, the user's pcell code may also be optionally changed to preserve fluid edits during adjustment of parameter values of selected instances, for example, during abutment of one or more instances to other instances.

Retaining Users Fluid Cell Edits During Abutment

The present general inventive concept also provides a function for users to retain user edits during abutment, or other parameter changes to fluid (edited) pcells. For example, a dbOpenFluidCellView(oaDesign* superMaster, char*fluidKey function can be provided to return cellViewId or null, to open the fluid edited subMaster from disk and return its cellview identification if the key is valid. This function does not violate the general rule that pcell's should depend purely on parameter values since the supplied superMaster and fluidKey parameter value uniquely identifies a particular fluid pcell subMaster stored on disk. Unlike the fluidEdit command, there is no change in the value of the fluidKey parameter on instances during abutment.

The function allows users to modify their pcell code to optionally create a new pcell subMaster by starting from and copying the geometry of edited cellviews. This is useful not just to retain user edits during abutment, but in fact to retain user edits after any parameter change to the fluid-edited pcells. Thus, if the user wants to retain user edits during abutment their pcell code has to change to deal with the edits. Otherwise the user edits would be lost during abutment/unabutment, if the abutment/unabutment software modifies pcell instance parameters as is the general practice.

For example, when two pcell instances are overlapped such that their source and drains are on the same net, then layout engines can trigger user-defined code or internal code to change specific pcell parameters of these two instances, such that the source and drain shapes are adjusted to account for touching each other, and contact shapes removed etc. In conventional approaches, if a fluid edited pcell instance has any of its parameters subsequently modified, then the change in parameters will result in re-evaluation of the pcell SKILL code, for that set of parameters, and any fluid edits would be lost.

As described below, the present general inventive concept provides a mechanism for pcell authors to modify their pcell code such that fluid edited shapes can be preserved during subsequent parameter changes, for example during abutment.
dbOpenFluidCellView Function To preserve fluid edited shapes during subsequent parameter changes, a new function can be provided, namely:
oaDesign* dbOpenFluidCellView(oaDesign* superMaster, char* fluidKey).

This new function can take a pointer to an oaDesign containing a pcell superMaster, and a fluidKey corresponding to the parameter value of a previously created fluidedited subMaster. Here, if the fluidKey supplied is a non-null, non-empty string, the function will open the fluid-edited subMaster of the given superMaster, corresponding to that fluidKey, from its fluid edit disk file if not in memory, and return an oaDesign pointer to that fluid-edited subMaster. Otherwise, the function returns nil.

During evaluation of a new subMaster (in the on Eval function in subclasses of IPCell) the user's pcell code can make a call to dbOpenFluidCellView in order to obtain a pointer to the oaDesign representing an existing fluid-edited subMaster, from which the fluid edited shapes can then be copied and merged into the new subMaster currently being constructed. Here, the user's pcell code needs to first open the existing fluid-edited subMaster by make a single function call:
editedCV=dbOpenFluidCellView(superMaster, fluidKey)

Note that the fluidKey parameter encodes the identity of the disk file and the pcell subMaster in that file. Therefore, only the superMaster and the fluidKey parameter is required to open a fluid edited subMaster from the co-managed fluid edit disk file that it is stored in. It is also noted that the present general inventive concept can be applied to pcells other than SKILL based ones.

The present general inventive concept will be described in more detail with reference to the examples below, but is not limited thereto. The following examples are for illustrative purposes only and are not intended to limit the scope of the invention. In the following examples, the various scenarios are illustrated when geometry pattern matching is not implemented in the fluid edit commands. However, those skilled in the art will appreciate that the methods and operations of the present general inventive concept could be embodied with or without pattern matching without departing from the broader principles and spirit thereof.
Abutment Example Suppose the user wants to put a contact in center of drain diffusion, even if the user has edited that diffusion, when the drainContact parameter is t. In this case, pcell code can be used to open the previously created fluid edited subMaster, and to copy the edited diffusion shape from the fluid edited subMaster to be the diffusion shape in the new subMaster being created, instead of creating the new subMaster from scratch.

Similar pcell code can be used to copy other fluid edited shapes from a fluid edited subMaster into the current subMaster being constructed.

Functions can be developed to allow a user's pcell code to open fluid edited subMasters which were previously stored in memory, for example, in a fluid edit disk file. A superMaster parameter can be used to indicate which particular pcell subMaster the function will open. A fluidKey parameter value can be used to identify the design cellview whose fluid edit disk file should be looked in, as well as the particular fluid edited subMaster to be copied. The user's pcell code can then copy previously fluid edited shapes from the particular fluid-edited subMaster into the new subMaster under construction. In this case, no new fluid edited subMasters need be created during abutment, so no degradation in abutment performance is experienced, and no key computation or matching is required, as illustrated in the following examples.

Example 1

Retaining Fluid Edits after Abutment

Figure 8:
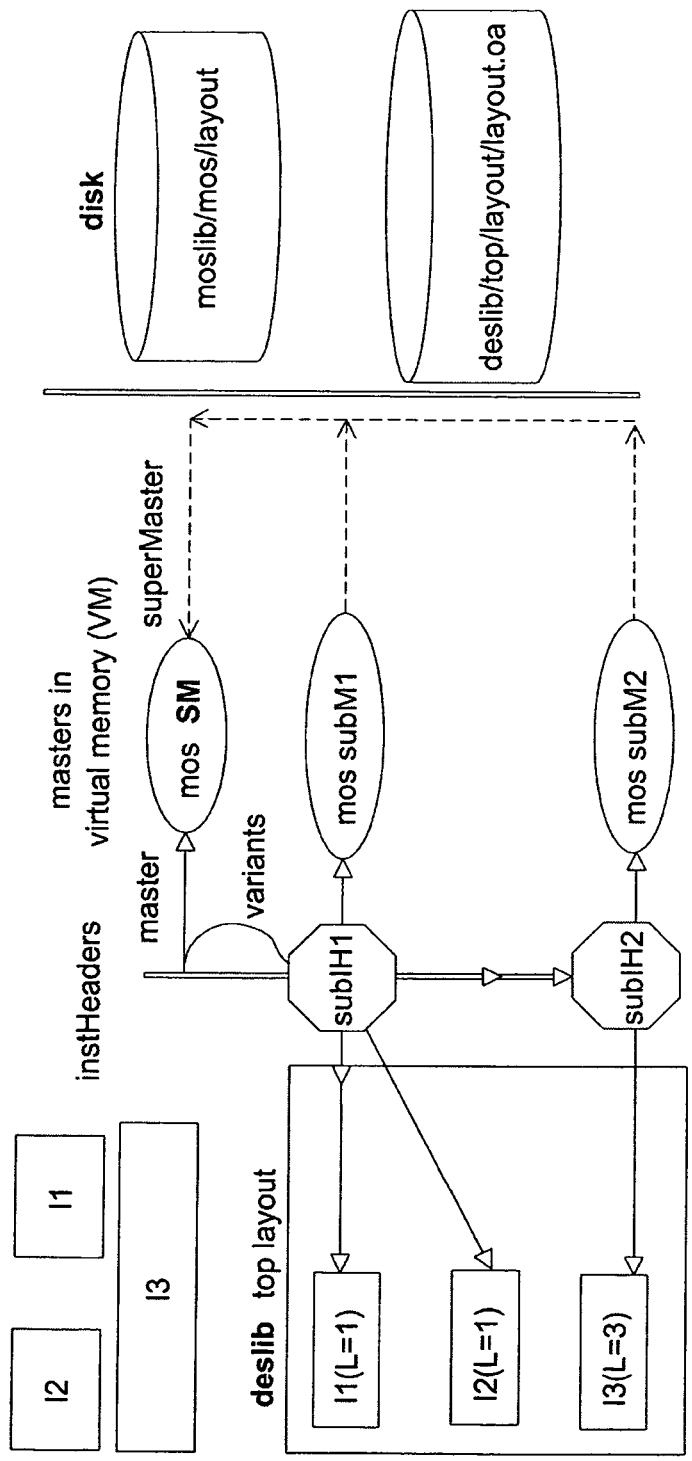
FIG. 8 is a block diagram illustrating instances I1, I2, and I3 of a layout design, before fluid edits have been made.

FIG. 8 illustrates an initial design state, where no fluid edits have been done. The relevant layout design is deslib/top/layout cellview. Here, three (3) instances of pcell moslib/mos/layout (I1, I2, and I3) have been instantiated. I1 and I2 have length parameter (L=1), while I3 has length parameter=3. Assume the default length parameter value is 0.5, and assume moslib/mos/layout pcell also has srcAbut and drainAbut boolean parameters default value set to false. Here, the parameters stored on the instance headers instHeaders may take the following values, for example:
subIH1: L=1
subIH2: L=3

Figure 9:
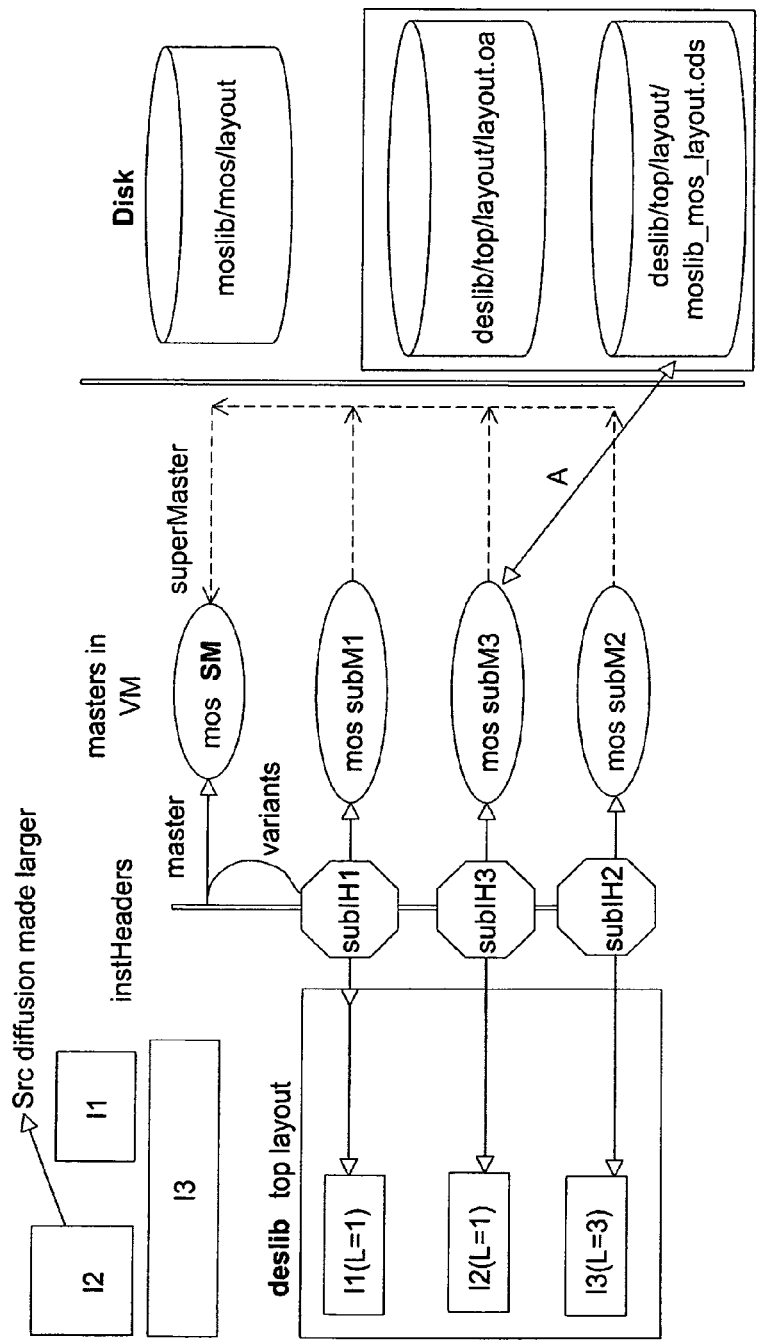
FIG. 9 is a block diagram illustrating the layout design of FIG. 8, after fluid edit of I2.

FIG. 9 illustrates the design state after instance I2 has been fluid edited. In FIG. 9, the user initiates a fluid edit by selecting instance I2, and invoking the fluidEdit command (or whichever means of fluid-edit initiation the EDA tool chooses to implement). This will set the I2 fluidKey parameter to "deslib/top/layout, 1" and behind the scenes instance I2 is now bound to a new subMaster in which fluid edit takes place. Next, the user stretches the diffusion shape of I2 to make the Src diffusion larger as illustrated in FIG. 9. Here the parameters stored on the instance headers instHeaders may take the following values, for example:
subIH1: L=1
subIH2: L=3
subIH3: L=1; fluidKey="deslib/top/layout, 1"

Upon the user's return from the fluidEdit, the fluidKey parameter remains the same as above, since no pattern matching has been implemented. Accordingly, upon a user initiated save of the top layout design, newly created subMaster mos_SubM3 (identified with instHeader subIH3) with the above-identified fluidKey is saved to the fluid edit disk file deslib/top/layout/moslib_mos_layout.cds associated with (co-managed with) deslib/top/layout cellview, as indicated by the arrow A.

Figure 10:
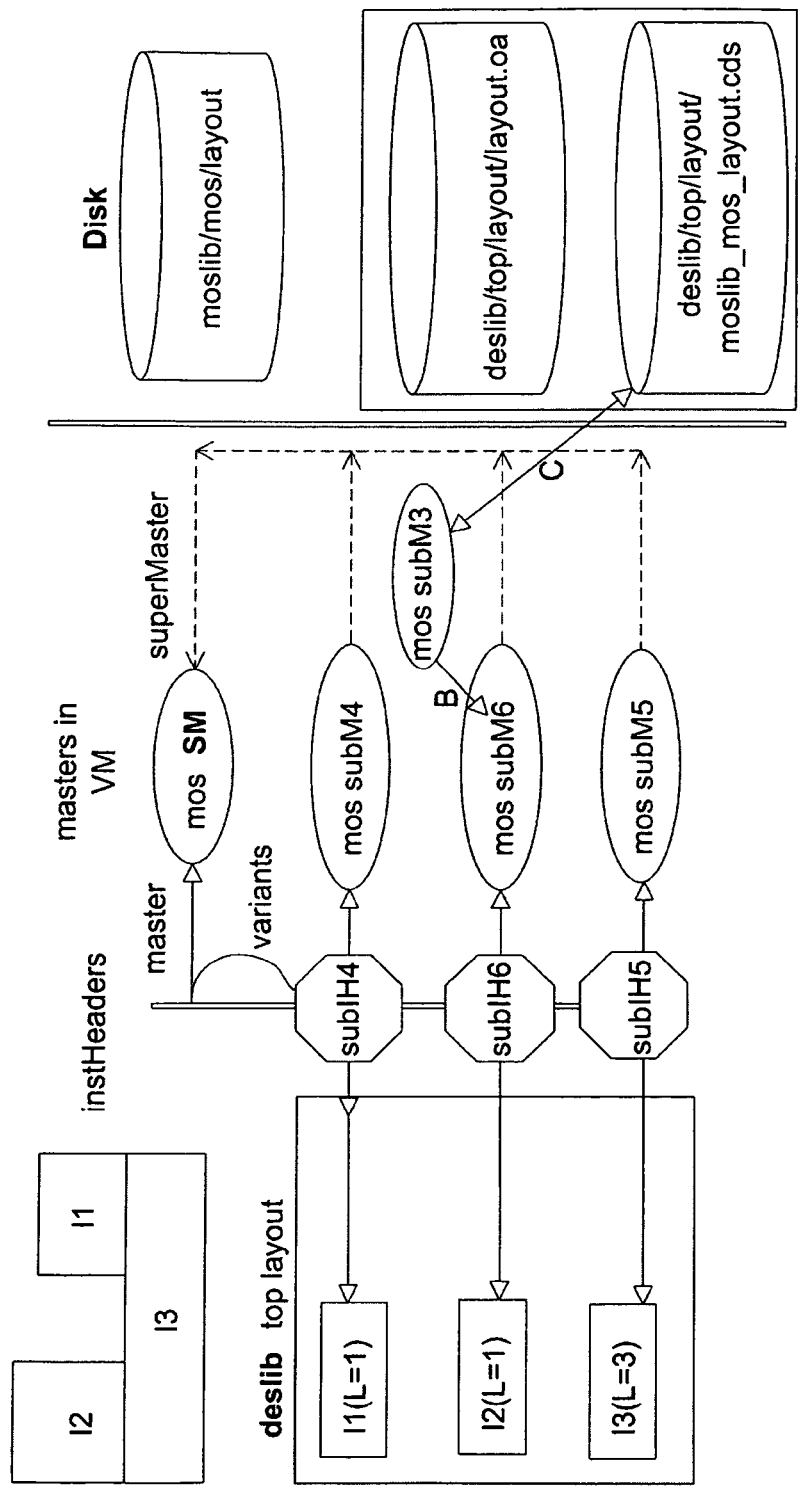
FIG. 10 is a block diagram illustrating the layout design of FIG. 9, after abutment of I1 and I2 to I3.

FIG. 10 illustrates the deslib/top/layout cellview after multiple abutment of I1 and I2 to I3. Here, the instance headers which store the parameters of I1, I2, and I3 are labeled subIH4, subIH6, and subIH5, respectively. Here the parameters stored on the instance headers instHeaders may take the following values, for example:
subIH4: L=1; drainAbut=t
subIH5: L=3; srcAbut=t
subIH6: L=1; drainAbut=t, fluidKey="deslib/top/layout, 1"

During pcell evaluation for mos subM6 associated with stretched diffusion shape I2, the call to dbOpenFluidCellView(fluidKey) results in an oaDesign pointer referencing the fluid edit subMaster mos_subM3, since the subMaster with that unique key will be found in virtual memory (VM) (and in the fluid cell disk store). The pcell code can then retrieve the edited source diffusion shape of I2 from the fluid-edited subMaster mos_subM3 and copy it into the new sub-master mos_subM6 rather than reconstruct the source diffusion shape. Accordingly, this results in the subMaster mos_subM6 being derived from the subMaster mos_subM3, which is in memory and is stored in the co-managed disk file as illustrated by arrows B and C, and the subMaster for mos_subM6 need not be saved into the co-managed fluid edit file on disk, upon a design save. Note that subMaster for mos_subM3 might no longer be in memory after this step, since it is no longer bound to any instance headers. Also note that the contents of deslib/top/layout/*.cds disk file have not changed.

UnAbutment Detail

Figure 11:
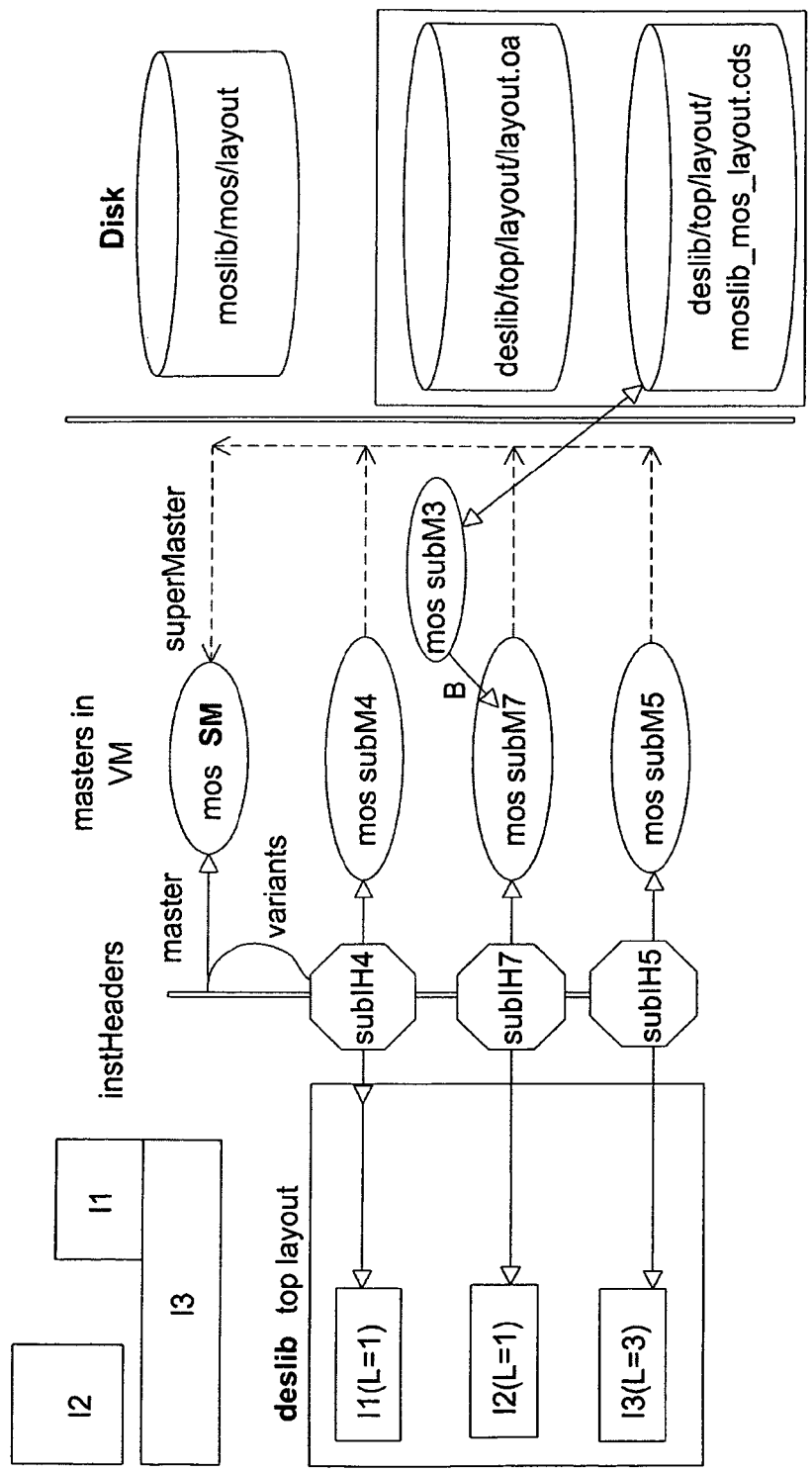
FIG. 11 is a block diagram illustrating the layout design of FIG. 10, after unabutment of I2 from I3.

FIG. 11 illustrates the deslib/top/layout cellview after unabutment of the fluid edited I2 from I3. Here, the instance headers of I2 has been changed to subIH7. During pcell evaluation for newly created subMaster mos_subM7, the call to dbOpenFluidCellView(superMaster, key) would return an oaDesign pointer to fluid edited subMaster mos_subM3 as indicated by arrow B. The pcell code setting the parameters back for unabutment can then retrieve the edited source diffusion shape from subMaster mos_subM3 and copy it into the new sub-master mos_subM7 rather than reconstruct the source diffusion shape. Arrow B in FIG. 11 from mos_subM3 subMaster to mos_subM7 denotes that mos_subM7 is derived from the fluid-edited subMaster. Again, mos_subM3 might not exist in memory after the unabutment, since no instance is bound to it, and it could be purged. However subM3 must remain in the disk fluid edit store, so that subM7 can again be constructed from it when the top level design is saved and then re-opened in a subsequent invocation of the program. Also note that once again, the contents of deslib/top/layout/*.cds have not changed. The parameters stored on the instance headers instHeaders may take the following values, for example:

subIH4: L=1; drainAbut=t
subIH5: L=3; srcAbut=t
subIH7: L=1; fluidKey="deslib/top/layout, 1"

Figure 12:
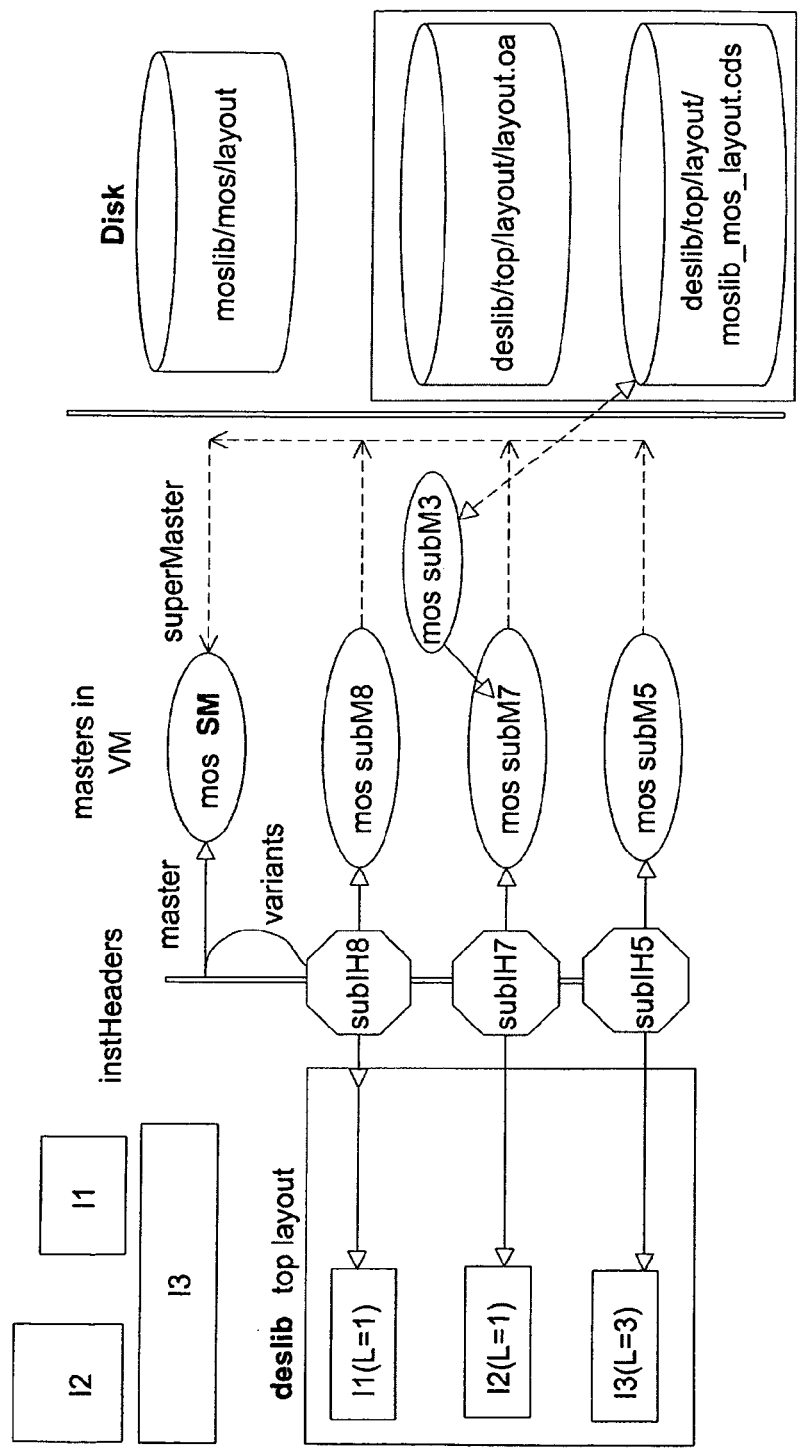
FIG. 12 is a block diagram illustrating the layout design of FIG. 11, after unabutment of I1 from I3.

FIG. 12 illustrates the deslib/top/layout cellview after unabutment of I1 from I3. This figure is similar to FIG. 11, except it illustrates newly created subMaster mos subM8 which was derived from mos subM4 of FIG. 11. Note that the contents of deslib/top/layout/* have again not changed after the user saves the top design. Here, the parameters stored on the instance headers instHeaders may take the following values, for example:

subIH8: L=1; drainAbut=t
subIH5: L=3; srcAbut=t
subIH8: L=1; fluidKey="deslib/top/layout, 1"

Detail of Events During Second Fluid Edit of I2

Figure 13:
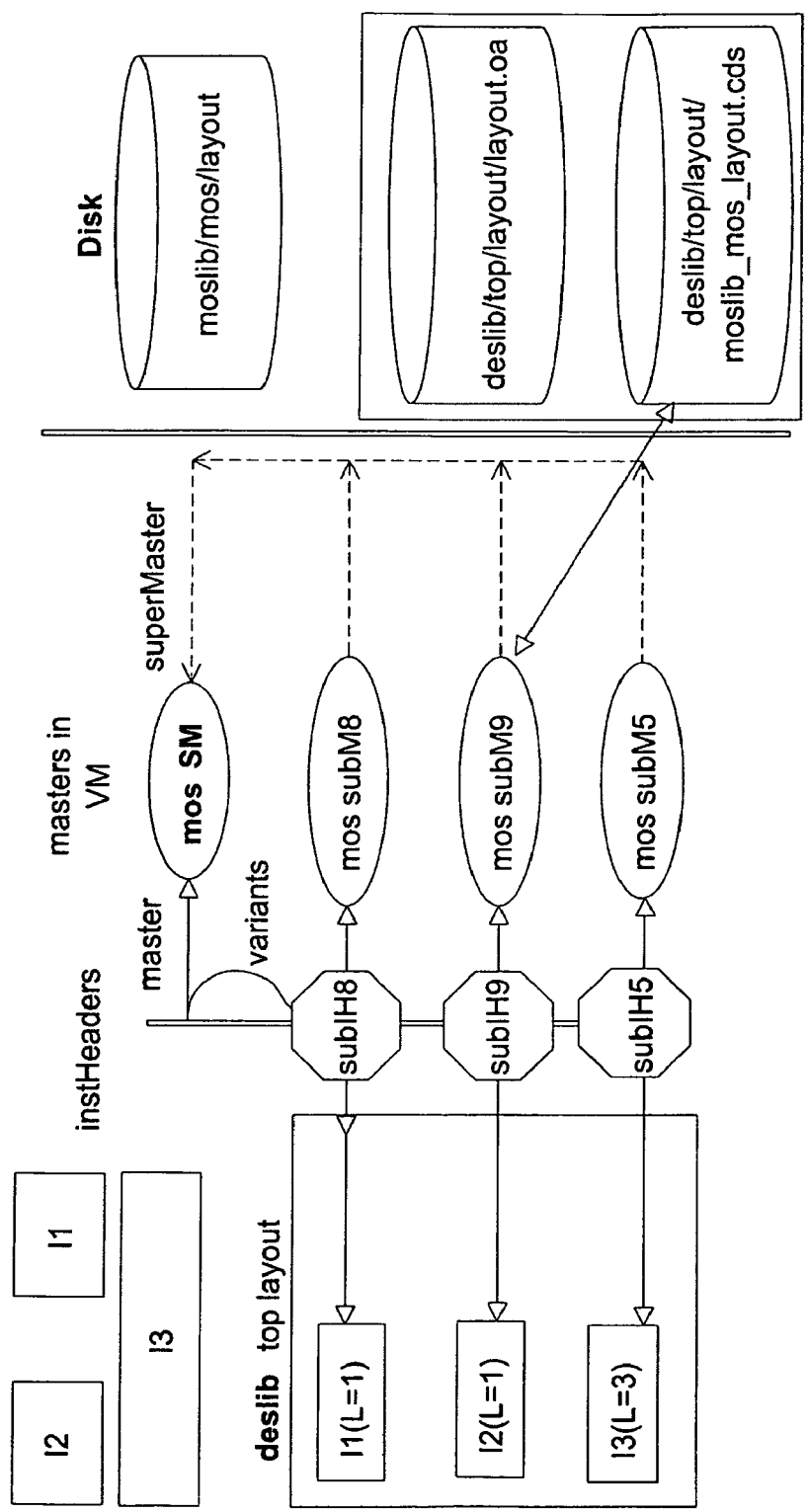
FIG. 13 is a block diagram illustrating the layout design of FIG. 12, after another fluid edit of I2 reverting I2 back to its original shape.

FIG. 13 illustrates the deslib/top/layout cellview after a second edit of I2, reverting I2 back to the original diffusion shape. Upon completion of the fluid edit, a new fluidKey is computed for the edit, namely "deslib/top/layout,2", which uniquely identifies the second edit of I2. Here, the parameters stored on the instance headers instHeaders may take the following values, for example:

subIH8: L=1
subIH5: L=3
subIH9: L=1; fluidKey="deslib/top/layout, 2"

At this time, the layout editor program can have a choice. The instructions of the program can either implement pattern matching, to detect whether the second fluid edited subMaster mos subM9 has the same geometry as an existing sub-master of the same cellview (and same parameters). In this case, it would be possible to bind I1 and I2 to the same non-fluid edited subMaster after the second edit of I2, since they both again have the same parameters. Alternatively, if no pattern matching is implemented, and each fluid edit always results in a new subMaster associated with the fluid edit, then a new fluidKey parameter value can be computed for the re-edited subMaster of I2, and we get the result illustrated in FIG. 13. Here, note that when the top level design is saved, co-managed disk file deslib/top/layout/*.cds now contains fluid edit sbmaster mos_subM9 which has fluidKey "deslib/top/layout, 2" as identified above.

Figure 14:
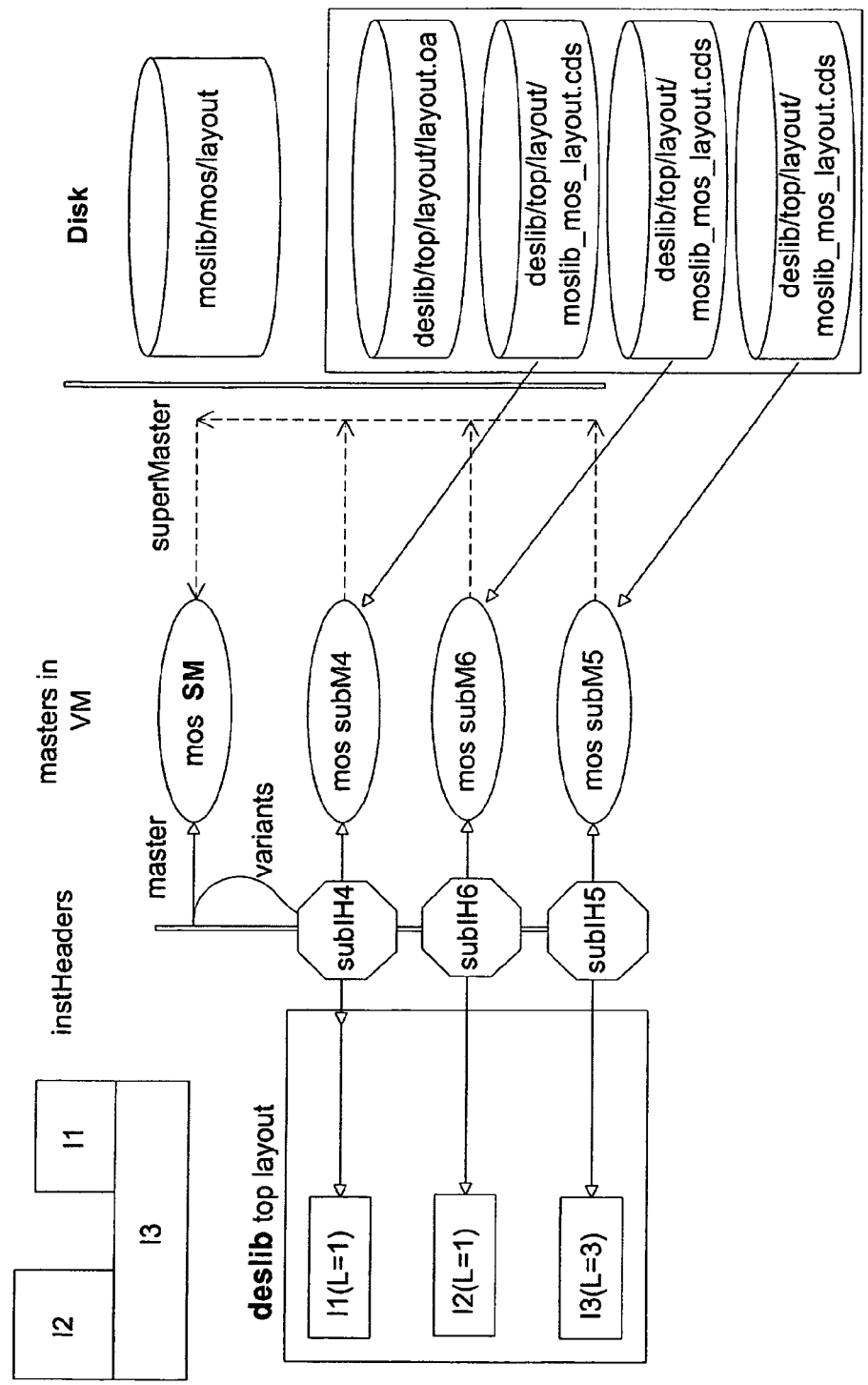
FIG. 14 is a block diagram illustrating the layout design similar to FIG. 10, according to another embodiment of the present general inventive concept.

FIG. 14 illustrates an alternative abutment approach, illustrating multiple abutment of I1 and I2 to I3, followed by a save. It should be appreciated that those skilled in the art may choose to implement abutment as another embodiment to retain fluid edits differently from that described above with respect to Example 1. That is, they may choose to abut a fluid-edited instance to another instance (which may or may not be fluid edited) by making a new fluid-edited subMaster initially copied from the sub-master of the original fluid-edited instance, assigning that new subMaster a new fluidKey value, and then editing the figures and shapes in that subMaster in a manner so that it is correct for abutment. Such technique is illustrated in FIG. 14. Here, none of the "regular" non-fluid pcell parameters of any of the three instances being abutted are modified. Instead three new fluid subMasters are created. The three fluid subMasters are then edited automatically by software which can adjust their content to be correct for abutment. Those skilled in the art will appreciate that the general inventive concept covers any such alternative approach to preserve fluid edits by creating new fluid-subMasters during auto-abutment. In this case, the contents of deslib/top/layout*.cds has been changed, and the parameters stored on the instance headers instHeaders may take the following values, for example:

subIH4: L=1; fluidKey="deslib/top/layout, edit2"
subIH5: L=3; fluidKey="deslib/top/layout, edit3"
subIH6: L=1; fluidKey="deslib/top/layout, edit4"

Example 2

Hierarchical Fluid Edits

Figure 15:
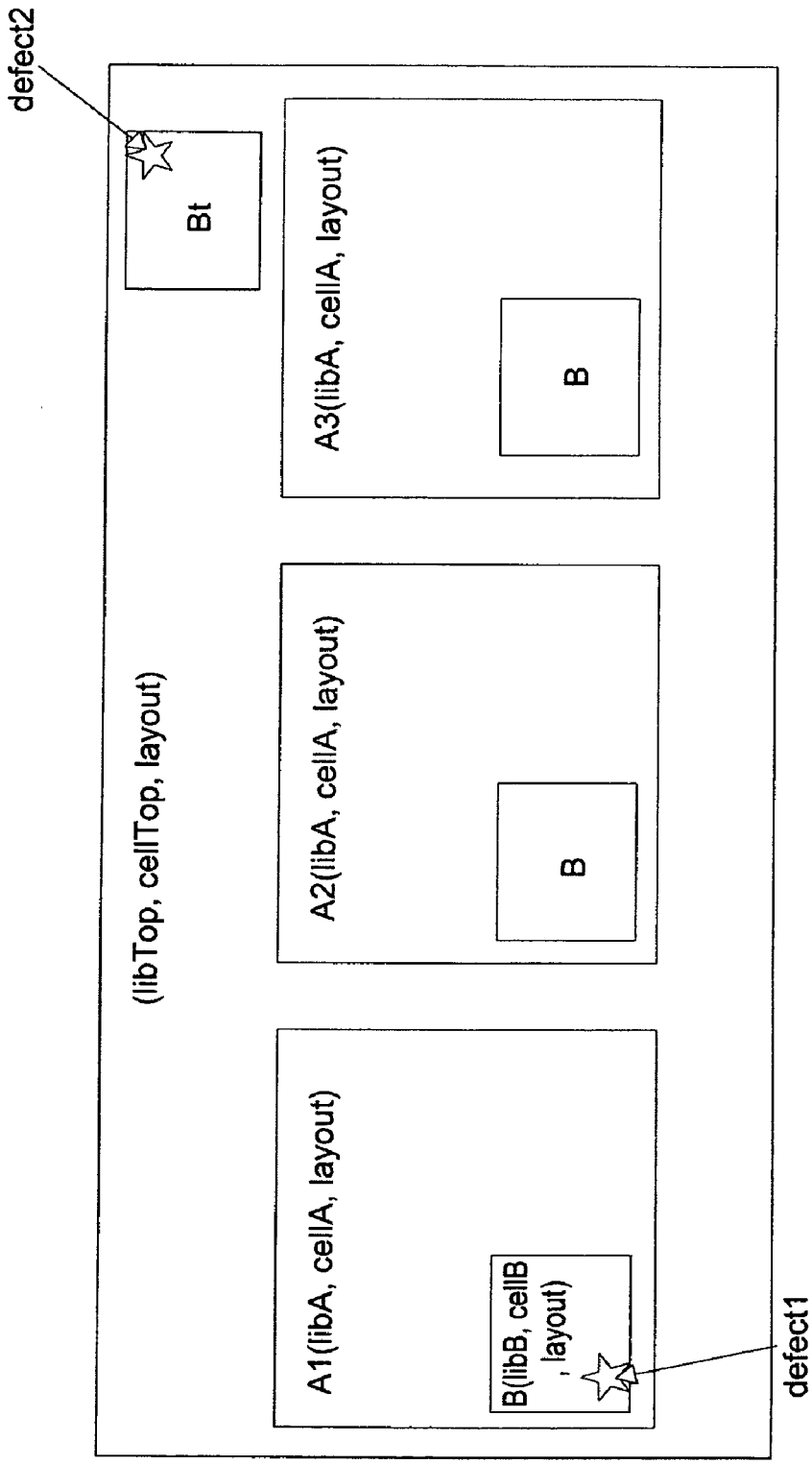
FIG. 15 is a block diagram illustrating a hierarchical layout design having defects in the top right corner and bottom left corner of the design.

FIG. 15 illustrates a design named (libTop, cellTop, layout) containing three instances of the same cellA, and one instance named Bt of cell cellB. CellA also contains one instance of cellB. Here, there is illustrated a defect or "hotspot" region (star) in the left bottom region of the chip labeled defect1, and a second defect in the top right region of the chip labeled defect2. The defects were identified by a DFM (design for manufacturing) hotspot analysis tool. This illustrates how fluid edits could be applied hierarchically to fix local DFM issues while retaining design hierarchy.

Suppose (libA, cellA, layout) is not a pcell, but (libB, cellB, layout) is a pcell. In order to fix defect1 in the bottom left corner of the design, a user can take the following steps. First, the user (or tool) can fluid edit the master of instance A1, and then further fluid edit the instance B. Having fixed the problem in the fluid edited instance of B, the user can return from the fluid edit of B, and then return again from A1. Now, the hierarchical design with one DFM issue has been fixed, but the original design hierarchy has been maintained.

Figure 16:
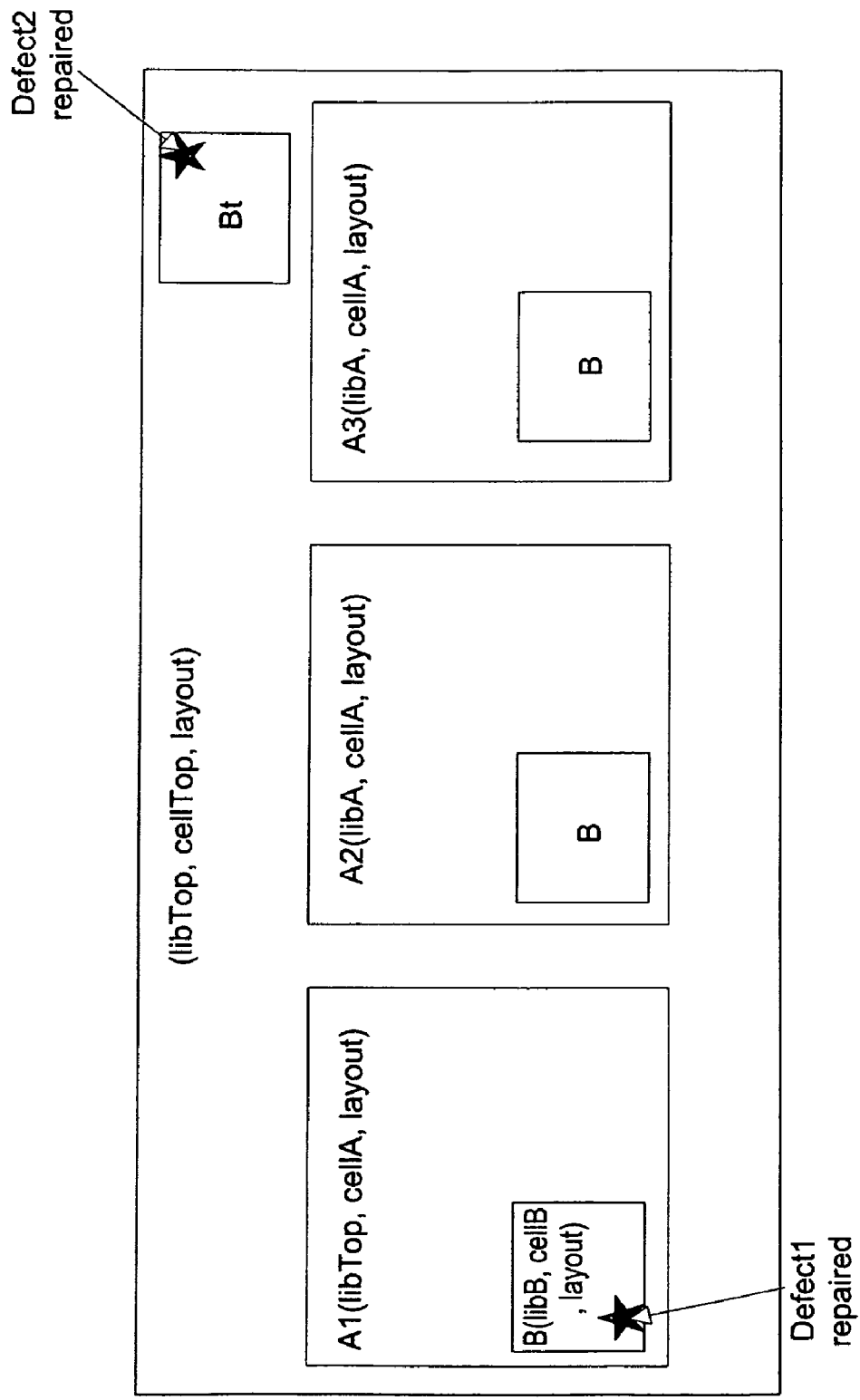
FIG. 16 is a block diagram illustrating the hierarchical layout design of FIG. 15, after the defects have been fixed using techniques of the present general inventive concept.

FIG. 16 illustrates the design of FIG. 15, after the fluid edits were made to fix the DFM hotspot issues. As illustrated in FIG. 16, upon a user save of the modified design, there will be two subMasters in fluid edit co-managed disk files, that is, the (libTop, cellTop, layout) co-managed file will have a fluid edit subMaster for (libTop, cellA_pcell, layout), and instance A1 being remastered to cellview (libTop, cellA_pcell, layout) and its fluidKey param will identify the variant that corresponds to the edited A1, and (libTop, cellA_pcell, layout) will have a fluid edit subMaster of (libB, cellB, layout) in its co-managed disk file, and instance B inside the newly created fluid subMaster of A1 is bound to it.

Accordingly, the present general inventive concept can provide fluid-editing techniques to edit the geometry of cell masters of particular instances in a layout design, as illustrated by this non-limiting "hotspot" fixing example.

In order to fix the defect2 in the top right corner of the layout design, a user may fluid edit instance Bt to make the fix. Accordingly, upon a user save of the modified design, the fluid edited subMaster of (libB, cellB, layout) can be stored in the co-managed fluid edit disk file of cellview (libTop, cellTop, layout), and instance Bt's instHeader can then be bound to it.

Therefore, as illustrated in FIG. 15, the fixing of the two defects may involve two invocations of fluid editing—one to fix the first defect and then another to fix the second defect. Similarly, in cases where the user may directly edit shapes inside the subMasters without having to manually invoke the fluidEdit command, the two fixes would still be done one at a time.

Now, suppose there are two top level instances of cellB, namely Bt1 and Bt2 (not illustrated), which are both bound to the same subMaster, and both have the same defect that needed repair. In this case, the technique to fix the defects would allow the user to simultaneously select both Bt1 and Bt2, followed by a user-initiated or auto-initiated fluid-edit command. The user would then be able to edit the shapes in the master of Bt1 or Bt2, with results being that both Bt1 and Bt2 are bound to the same modified master.

Although certain embodiments of the present general inventive concept have been described above, other embodiments may also provide for the functional components to be manufactured, transported, marketed and/or sold as processor instructions encoded on computer-readable media. The present general inventive concept, when so embodied, can be practiced regardless of the operating system platform on which the processor instructions are executed and regardless of the manner by which the processor instructions are encoded on the medium. For example, the present general inventive concept may be practiced on a variety of operating system platforms without departing from the principles and spirit of the present general inventive concept.

The embodiments of the present general inventive concept may improve the mechanics of inserting pcell instances into designs and improve methods of manipulating design data while observing the large body of conventions, design rules, and connectivity models that instances of pcells abide by throughout the design system. Accordingly, more flexible and free editing of pcell subMasters is permitted compared with the current "modify parameter first" approach that existing methods provide. Such free editing is also very useful for fixing local design for manufacturability (DFM) issues in a particular region of a design. Other embodiments of the invention may in fact automatically generate the edited contents of new subMasters (for example layout compactors, defect repair tools and the like). Rather than manually editing the content of an existing subMaster to derive the content of a new fluid edited subMaster, such automated tools automatically generate the content of the new subMasters based upon the content of the existing subMasters. The general inventive technique covers such embodiments because they are essentially the same technique of creating a new subMaster derived from an existing subMaster (by manual edit or automatic tool) and associating one or more reserved fluid pcell parameters with that new subMaster.

As described herein, the present general inventive concept also provides, among other things, a method to allow retention of user-edits applied to cellviews, even during subsequent auto-adjustment of those cellviews, for example during parameter change due to auto-abutment. Accordingly, the user's fluid edits can be retained during auto-abutment.

Although embodiments of the present general inventive concept have been generally described with reference to the modification of pcells, it is understood that the present general inventive concept is not limited thereto. That is, the present general inventive concept allows a user to select an instance at various levels of abstraction in a layout design, and then push or descend into a master view of the selected instance with the layout editor to make edits and changes to the master sub-design, which can be either a programmable cell (pcell) or a regular (non pcell) design. Once the user has completed edits to the subMaster, the present general inventive concept then allows a user to choose which instances of the subMaster in the top-level design may incorporate the edits made to the subMaster.

In addition, a check-in of top level design cell view into Design Management system will result in check-in of the co-managed pcell cache associated with that top-level design, and it is not necessary for the user to flatten the hierarchical design in order to apply the new pcell variants to other top-level instances of the cell, thus retaining the hierarchical layout of the design, saving space, and preserving the original design intent. Accordingly, the present general inventive concept allows users to make layout edits to a hierarchical layout design, in such a way that they need not manually create any new cellviews, while retaining the design hierarchy.

As such, the present general inventive concept can be embodied as computer-readable codes on a computer-readable medium. The computer-readable medium can include a computer-readable recording medium and a computer-readable transmission medium. The computer-readable recording medium is any data storage device that can store data as programs which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can transmit carrier waves or signals (e.g., wired or wireless data transmission through the Internet). Also, functional programs, codes, and code segments to accomplish the present general inventive concept can be easily construed by programmers skilled in the art to which the present general inventive concept pertains.

It should be appreciated that the computer-readable medium described above may be any medium on which the instructions may be encoded and then subsequently retrieved, decoded and executed by a processor, including electrical, magnetic and optical storage devices, and wired, wireless, optical and acoustical communication channels. The computer readable medium may include either or both of persistent storage, referred to herein as "computer-readable recording media" and as spatiotemporal storage, referred to herein as "computer-readable transmission media". Examples of computer-readable recording media include, but not limited to, read-only memory (ROM), random-access memory (RAM), and other electrical storage; CD-ROM, DVD, and other optical storage; and magnetic tape, floppy disks, hard disks and other magnetic storage. The computer-readable recording media may be distributed across components, to include such distribution through storage systems interconnected through a communication network. The computer-readable transmission media may transmit encoded instructions on electromagnetic carrier waves or signals, or as acoustic signals through acoustically transmissive media. Moreover, the processor instructions may be derived from algorithmic constructions of the present general inventive concept in various programming languages, the mere contemplation of which illustrates the numerous realizable abstractions of the present general inventive concept.

The descriptions above are intended to illustrate possible implementations of the present invention and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalence.

What is claimed is:

1. A processor-based method of editing cells of a layout design, the method comprising:
    creating, using a processor-based control system, a new parameterized cell (pcell) submaster from a first cell master of the layout design, the first cell master having one or more instances bound thereto;
    assigning, using the processor-based control system, one or more key parameters to at least one instance of the one or more instances to bind the at least one instance to the new pcell submaster;
    modifying, using the processor-based control system, contents of the new pcell submaster; and
    and and updating, using the processor-based control system, contents of the at least one instance according to the modified contents of the new pcell submaster when the at least one instance is bound to the new pcell submaster.

2. The method of claim 1, further comprising: initiating a request to edit contents of the first cell master prior to creating the new pcell submaster.

3. The method of claim 2, wherein the initiating a request comprises:
    selecting the at least one instance of the first cell master; and invoking an edit command before or after the at least one instance is selected.

4. The method of claim 2, wherein the initiating a request comprises editing a shape within at least one instance of the one or more instances in a chosen level of the layout design.

5. The method of claim 2, wherein the initiating a request and the creating a new pcell submaster are performed, at least in part, by the processor-based control system according to a predetermined instruction.

6. The method of claim 5, wherein the predetermined instruction includes a program stored on a non-transitory computer readable medium.

7. The method of claim 6, wherein the program is a design for manufacturing (DFM) hotspot fixer or a layout compactor.

8. The method of claim 1, further comprising:
    saving the new pcell submaster to a non-volatile memory.

9. The method of claim 8, further comprising:
    determining whether the modified contents of the new pcell submaster substantially match the contents of a previously saved cell master; and
    when it is determined that the modified contents of the new pcell submaster substantially match the contents of the previously saved pcell submaster:
    replacing the key parameter of the at least one instance with the key parameter of the previously saved matching pcell submaster to bind the at least one instance to the matching pcell submaster; and
    purging the new pcell submaster from the non-volatile memory.

10. The method of claim 8, wherein the contents of the new pcell submaster are retrievable from the non-volatile memory after a new process design kit (PDK) version is installed to the non-volatile memory, even when pcell supermasters of the new PDK version comprise additional or less parameters compared to corresponding pcell supermasters of a previous PDK version stored in the non-volatile memory.

11. The method of claim 1, further comprising:
    determining whether the first cell master is a programmable pcell submaster or a non-programmable pcell master;
    and creating the new pcell submaster even when it is determined that the first cell master is the non-pcell master.

12. The method of claim 1, wherein the operation of creating a new pcell submaster is performed by pcell code to copy contents from a previously saved cell master to the new pcell submaster.

13. The method of claim 1, further comprising:
    creating another new pcell submaster when parameters of the at least one instance are changed;
    merging the content of the new pcell submaster into the another new pcell submaster; and
    binding the another new pcell submaster to the one or more changed instances.

14. The method of claim 13, wherein the parameters of the at least one instance are changed by abutment.

15. The method of claim 1, wherein the layout design comprises a hierarchical structure, wherein the one or more instances are instantiated on different levels of the layout design, and wherein the operation of updating the contents of the at least one instances is performed without changing the instantiated levels of the two or more instances.

16. A non-transitory computer readable medium having encoded thereon computer instructions that, when executed by a processor, perform the method of claim 1.

17. An electronic design automation (EDA) system, comprising:
    a control unit to create a new parameterized cell (pcell) submaster based on a first cell master, the first cell master having one or more instances bound thereto; and
    a graphical user interface to modify contents of the new pcell submaster such that the control unit assigns one or more key parameters to at least one instance of the one or more instances to bind the at least one instance to the new pcell submaster, modifies contents of the new pcell submaster, and updates contents of the at least one instance according to the modified contents of the new pcell submaster when the at least one instance is bound to the new pcell submaster.

18. The EDA system of claim 17, wherein the graphical user interface initiates a request to edit contents of the first cell master before the new pcell submaster is created.

19. The EDA system of claim 18, wherein a user initiates the request by selecting the at least one instance and by invoking an edit command with the graphical user interface.

20. The EDA system of claim 18, wherein a user initiates the request by editing a shape within at least one instance of the one or more instances in a chosen level of the layout design with the graphical user interface.

21. The EDA system of claim 17, further comprising:
a non-volatile memory to store the new pcell submaster.

22. The EDA system of claim 21, wherein:
the control unit determines whether the modified contents of the new pcell submaster substantially match the contents of a previously saved pcell submaster; and
when it is determined that the modified contents of the new pcell submaster substantially match the contents of the previously saved cell master, the control unit:
replaces the key parameter of the at least one instance with the key parameter of the previously saved matching pcell submaster to bind the at least one instance to the matching pcell submaster; and
purges the new pcell submaster from the non-volatile memory.

23. The EDA system of claim 21, wherein the non-volatile memory comprises a set of co-managed disk files which are read/write by an OpenAccess pcell application program interface (API).

24. The EDA system of claim 21, further comprising:
a process design kit (PDK) comprising a plurality of cell masters stored in the nonvolatile memory, wherein the contents of the new pcell submaster are retrievable from the nonvolatile memory after a new PDK version is installed in the non-volatile memory even when pcell supermasters of the new PDK version comprise additional or less parameters compared to corresponding pcell supermasters of the previous PDK stored in the non-volatile memory.

25. The EDA system of claim 17, wherein the control unit determines whether the first cell master is a programmable cell pcell submaster or a non-programmable pcell master such that when it is determined that the first cell master is a non-pcell master, the control unit creates the new pcell submaster based on the non-pcell master.

26. The EDA system of claim 17, wherein the layout design comprises a hierarchical structure, wherein the one or more instances are instantiated on different levels of the layout design, and wherein the operation of updating the contents of the at least one instance is performed without changing the instantiated levels of the two or more instances.

* * * * *

UNITED STATES PATENT AND TRADEMARK OFFICE
CERTIFICATE OF CORRECTION

PATENT NO. : 8,046,730 B1  
APPLICATION NO. : 12/222499  
DATED : October 25, 2011  
INVENTOR(S) : Kenneth Ferguson et al.

Page 1 of 1

It is certified that error appears in the above-identified patent and that said Letters Patent is hereby corrected as shown below:

Column 9, line 21, please delete "subMastert 14 and 15" and insert --subMaster1. I4 and I5--.

Column 9, line 23, please delete "14 and 15" and insert --I4 and I5--.

Column 11, line 36, please delete "evalulation" and insert --evaluation--.

Column 15, line 31, please delete "on Eval" and insert --onEval--.

Column 17, line 1, please delete "evalulation" and insert --evaluation--.

In the Claims:

Column 21, line 44, please delete the second occurrence of "and".

Signed and Sealed this  
Twenty-sixth Day of June, 2012

David J. Kappos  
*Director of the United States Patent and Trademark Office*